United States Patent
Pelella et al.

(10) Patent No.: US 7,223,640 B2
(45) Date of Patent: May 29, 2007

(54) SEMICONDUCTOR COMPONENT AND METHOD OF MANUFACTURE

(75) Inventors: Mario M. Pelella, Mountain View, CA (US); Darin A. Chan, San Francisco, CA (US); Simon S. Chan, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/071,375

(22) Filed: Mar. 3, 2005

(65) Prior Publication Data

US 2006/0197154 A1    Sep. 7, 2006

(51) Int. Cl.
| | |
|---|---|
| H01L 21/00 | (2006.01) |
| H01L 21/20 | (2006.01) |
| H01L 21/84 | (2006.01) |
| H01L 21/336 | (2006.01) |
| H01L 21/8234 | (2006.01) |
| H01L 21/425 | (2006.01) |

(52) U.S. Cl. .................. 438/149; 438/197; 438/479; 438/517

(58) Field of Classification Search ........ 438/190–210, 438/149, 479, 517
See application file for complete search history.

(56) References Cited

U.S. PATENT DOCUMENTS

| | | | |
|---|---|---|---|
| 4,889,829 A | 12/1989 | Kawai | |
| 5,170,227 A | 12/1992 | Kaneko et al. | |
| 5,340,754 A | 8/1994 | Witek et al. | |
| 5,759,907 A | 6/1998 | Assaderaghi et al. | |
| 5,807,776 A | 9/1998 | Tang | |
| 5,841,172 A | 11/1998 | Morishita et al. | |
| 5,889,293 A | 3/1999 | Rutten et al. | |
| 6,107,125 A | 8/2000 | Jaso et al. | |
| 6,384,676 B2 | 5/2002 | Kasa et al. | |

(Continued)

OTHER PUBLICATIONS

Hou-Yu Chen et al., "Novel 20nm hybrid SOI/bulk CMOS technology with 0.183[mu]m<2> 6T-SRAM cell by immersion lithography," 2005 Symposium on VLSI Technology, Jun. 14-16, 2005, Kyoto, Japan (IEEE Cat. No. 05CH37642) IEEE, 2005, pp. 16-17, XP002391525, Piscataway, NJ, USA, ISBN: 4-900784-00-1, Figures 1-2.

(Continued)

*Primary Examiner*—Cuong Nguyen
(74) *Attorney, Agent, or Firm*—Farjami & Farjami LLP

(57) ABSTRACT

A semiconductor component having analog and logic circuit elements manufactured from an SOI substrate and a method for manufacturing the semiconductor component. An SOI substrate has a support wafer coupled to an active wafer through an insulating material. Openings are formed in the active wafer, extend through the insulating material, and expose portions of the support wafer. Epitaxial semiconductor material is grown on the exposed portions of the support wafer. Analog circuitry is manufactured from the epitaxially grown semiconductor material and high performance logic circuitry is manufactured from the active wafer. The processing steps for manufacturing the analog circuitry are decoupled from the steps for manufacturing the high performance logic circuitry. A substrate contact is made from a portion of the epitaxially grown semiconductor material that is electrically isolated from the portion in which the analog circuitry is manufactured.

13 Claims, 14 Drawing Sheets

U.S. PATENT DOCUMENTS

| | | | |
|---|---|---|---|
| 6,534,831 | B2 | 3/2003 | Kato |
| 6,589,823 | B1 | 7/2003 | Beebe et al. |
| 6,621,108 | B2 | 9/2003 | Tashiro et al. |
| 6,627,502 | B1 | 9/2003 | Cho |
| 7,102,204 | B2 * | 9/2006 | Berndlmaier et al. ....... 257/532 |
| 2002/0113267 | A1 | 8/2002 | Brown et al. |
| 2003/0104658 | A1 | 6/2003 | Toshiharu et al. |
| 2003/0122124 | A1 | 7/2003 | Hajime et al. |
| 2004/0222486 | A1 | 11/2004 | Ellis-Monaghan et al. |

OTHER PUBLICATIONS

Yamada T et al., "An Embedded DRAM Technique on SOI/Bulk Hybrid Substrate Formed with SEG Process for High-End SOC Application," 2002 Symposium on VLSI Technology. Digest of Technical Papers. Honolulu, Jun. 11-13, 2002, pp. 112-113, XP001109841, New York, NY: IEEE, US, ISBN: 0-7803-7312-X, the whole document.

Chan, Mansun, King, Joseph C., Ko, Ping K., Hu, Chenming, *High Performance Bulk Mosfet Fabricated on SOI Substrate for ESD Protection and Circuit Applications*, IEEE International SOI Conference, Oct. 1994, pp. 61-62.

Chan, Mansun, King, Joseph C., Ko, Ping K., Hu, Chenming, *SOI/Bulk Hybrid Technology on SIMOX Wafers for High Performance Circuits with Good ESD Immunity*, IEEE Electron Device Letters, vol. 16, No. 1, Jan. 1995, pp. 11-13.

* cited by examiner

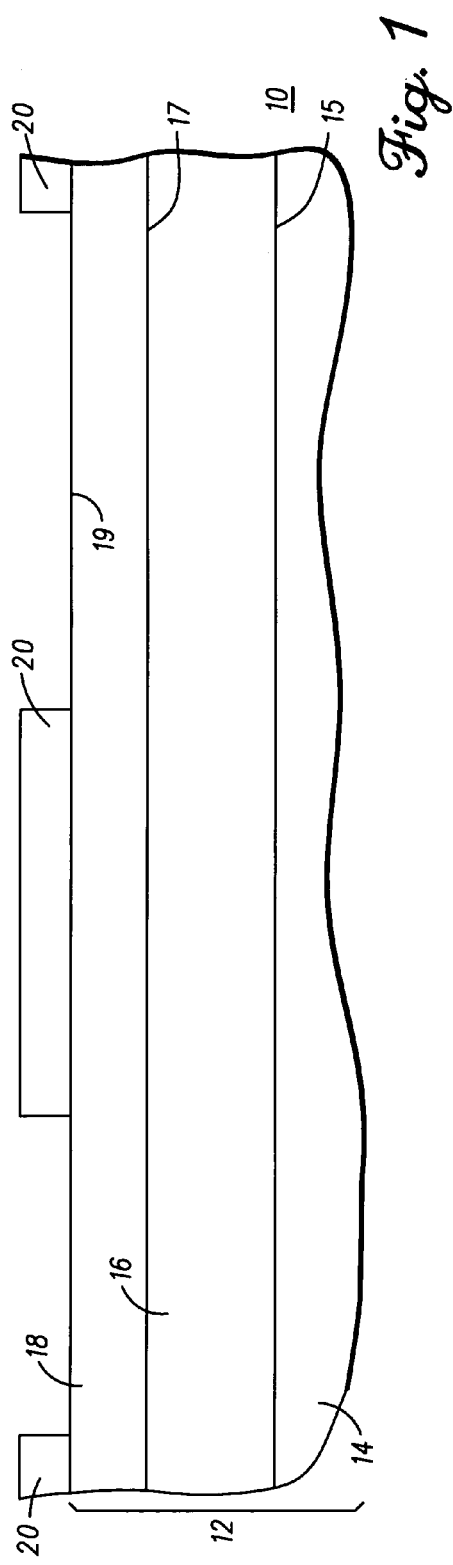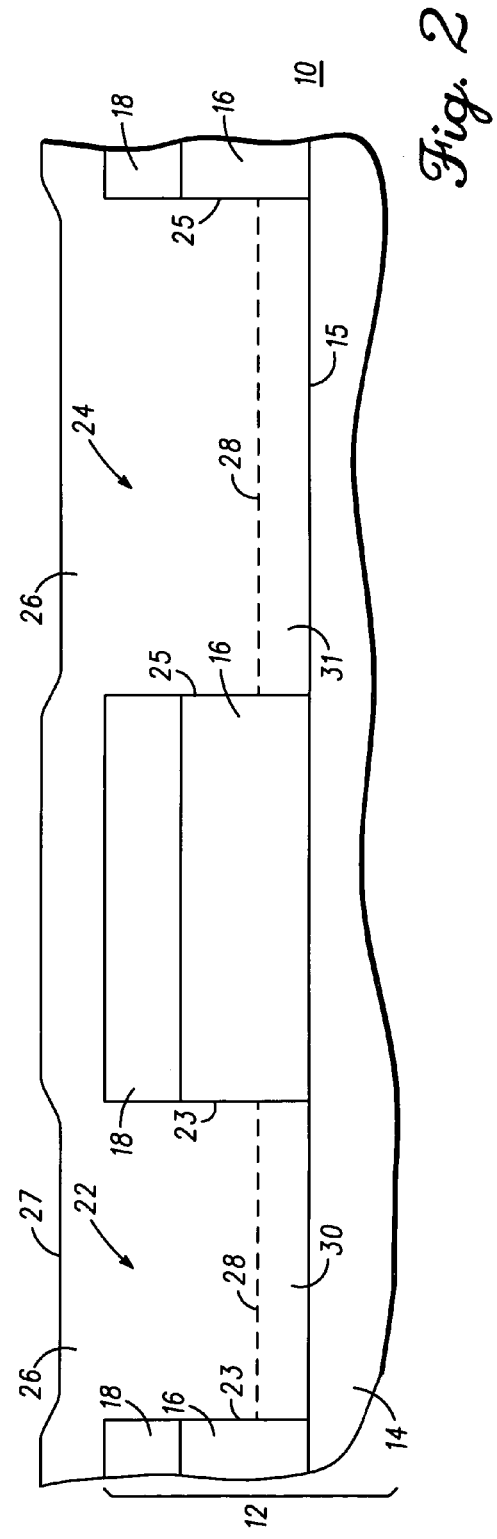

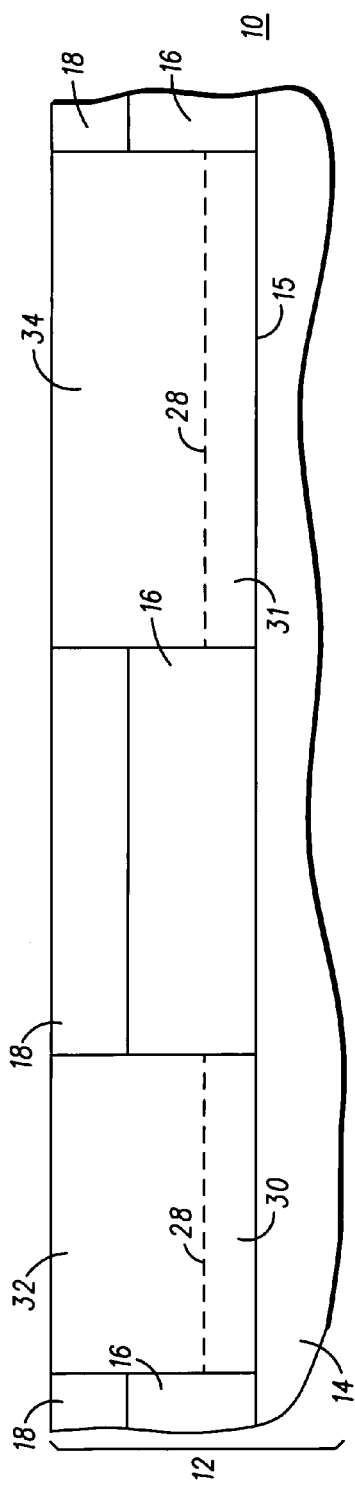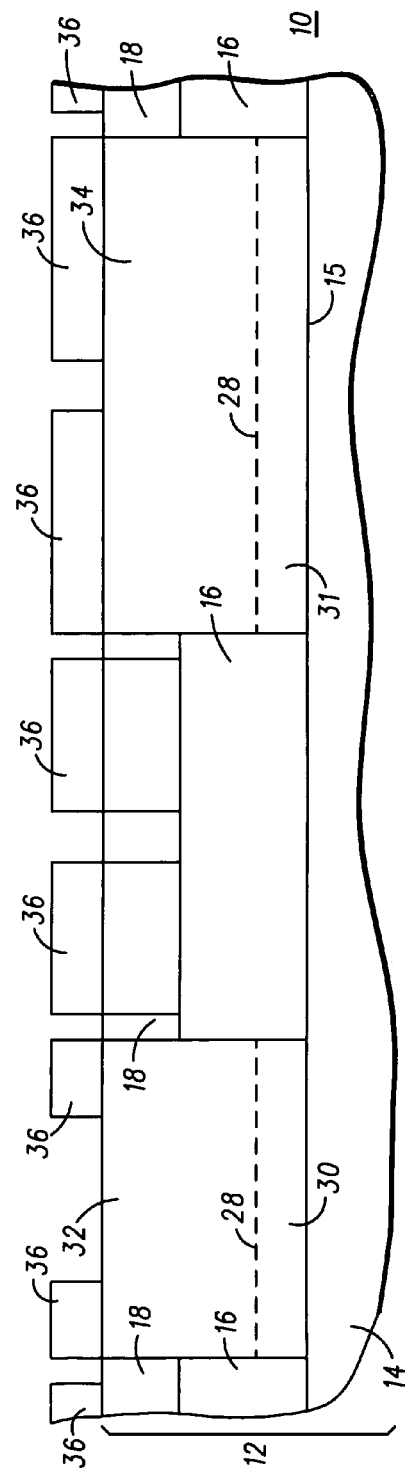

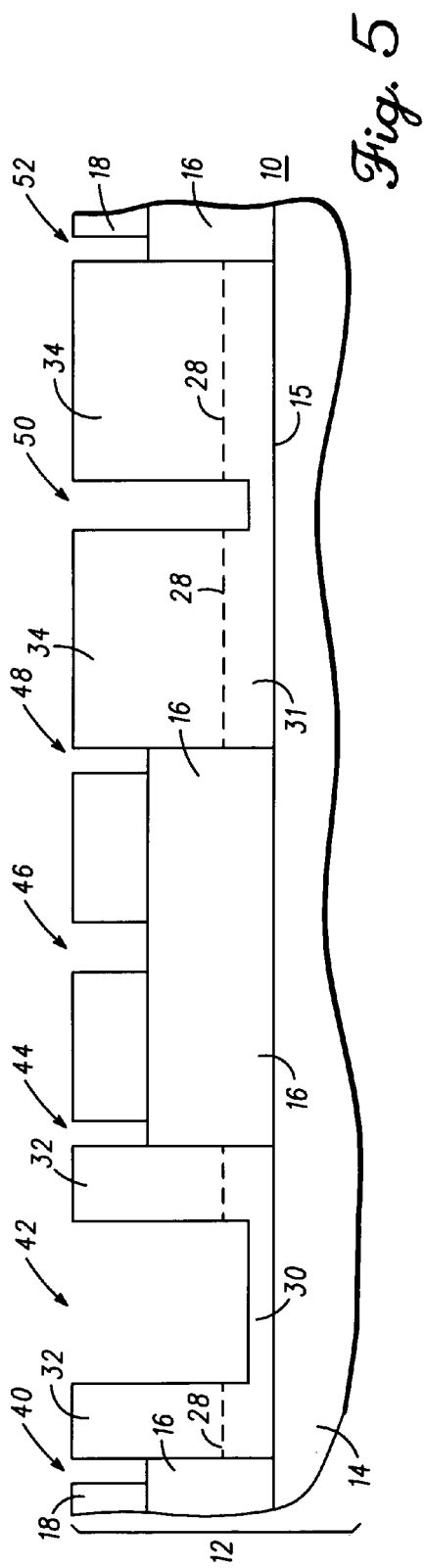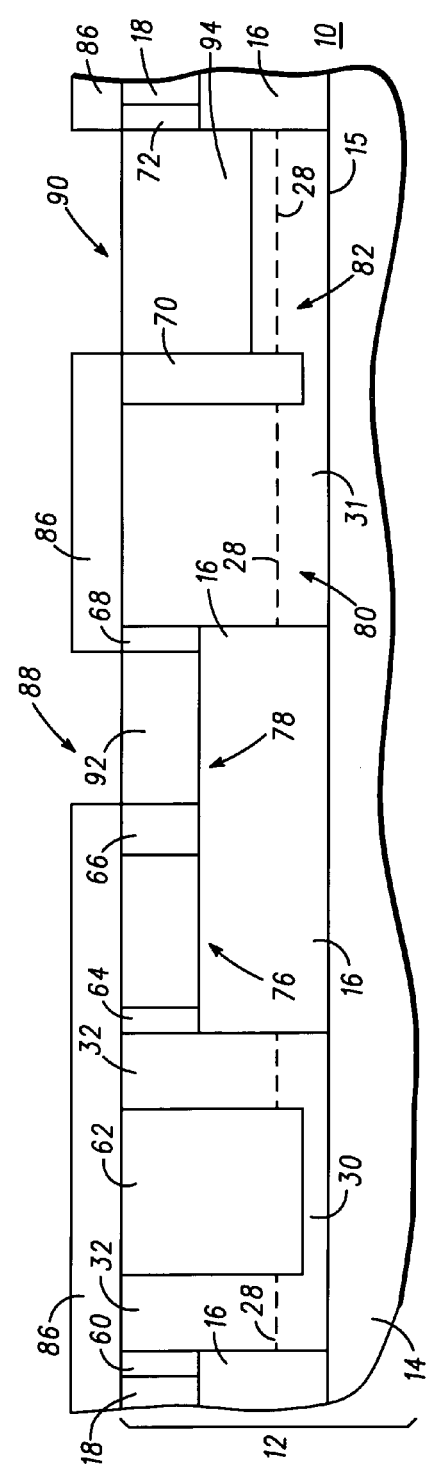

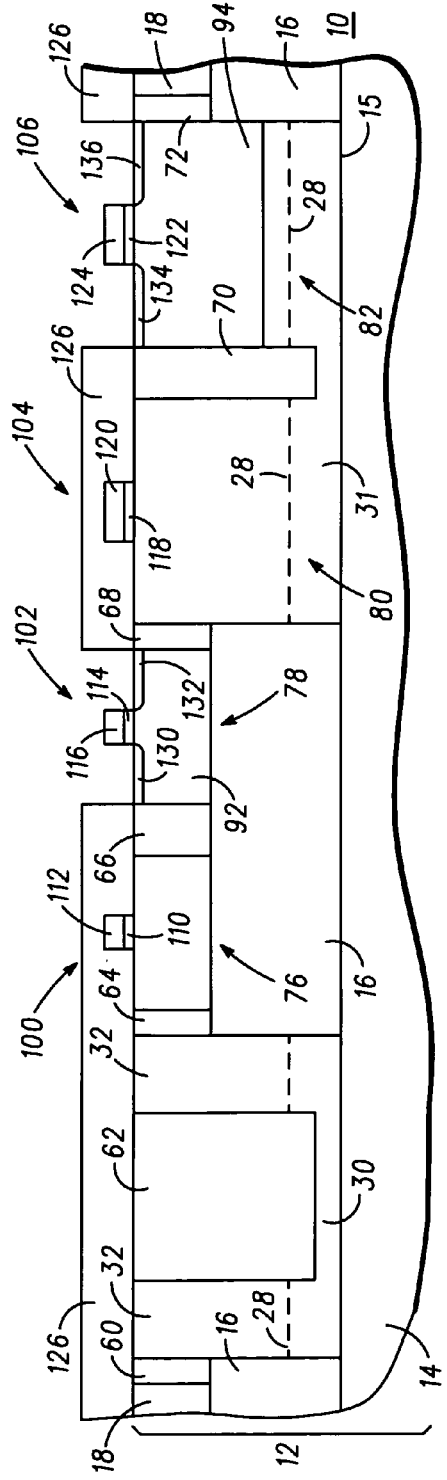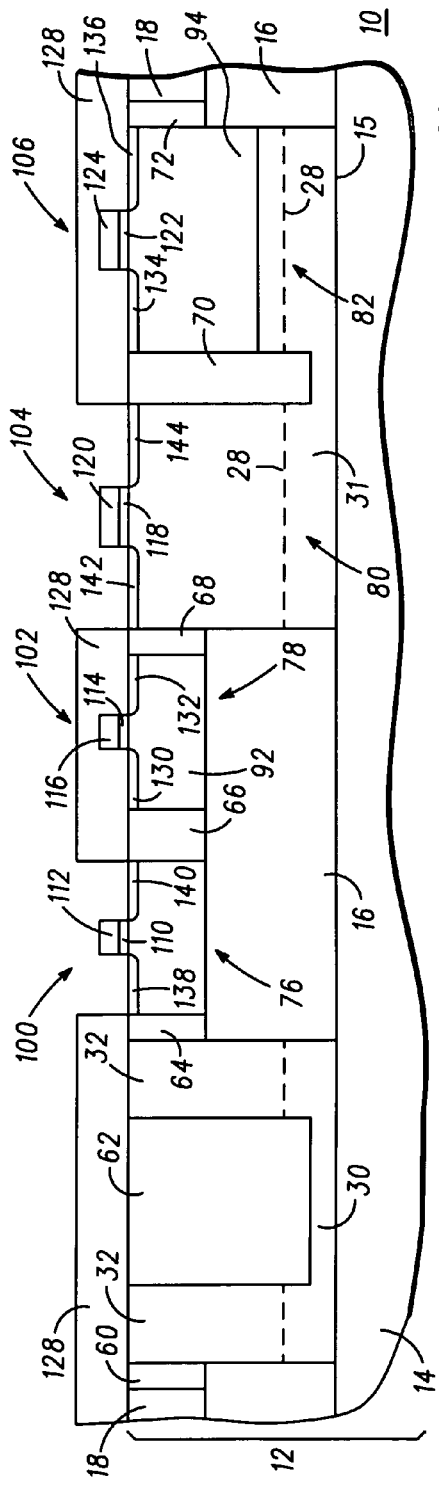

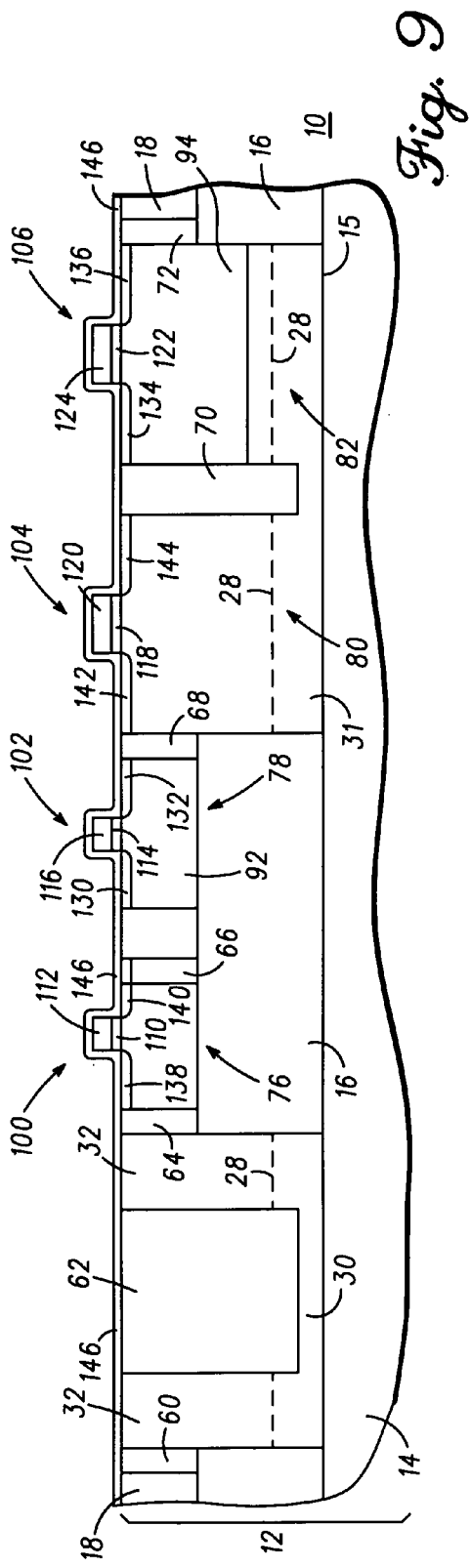
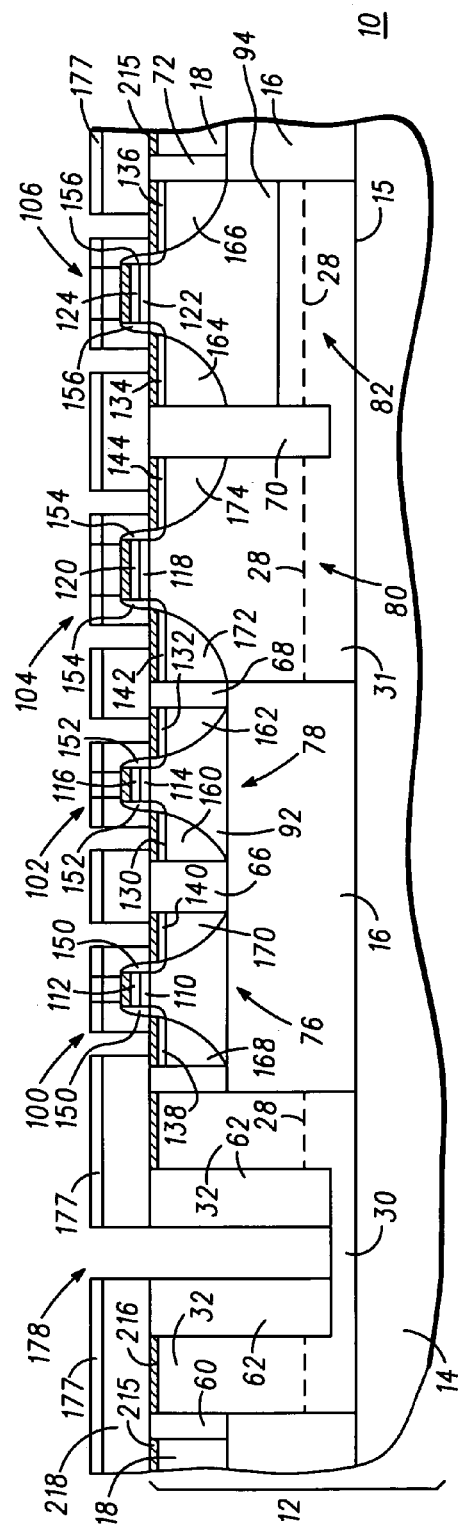

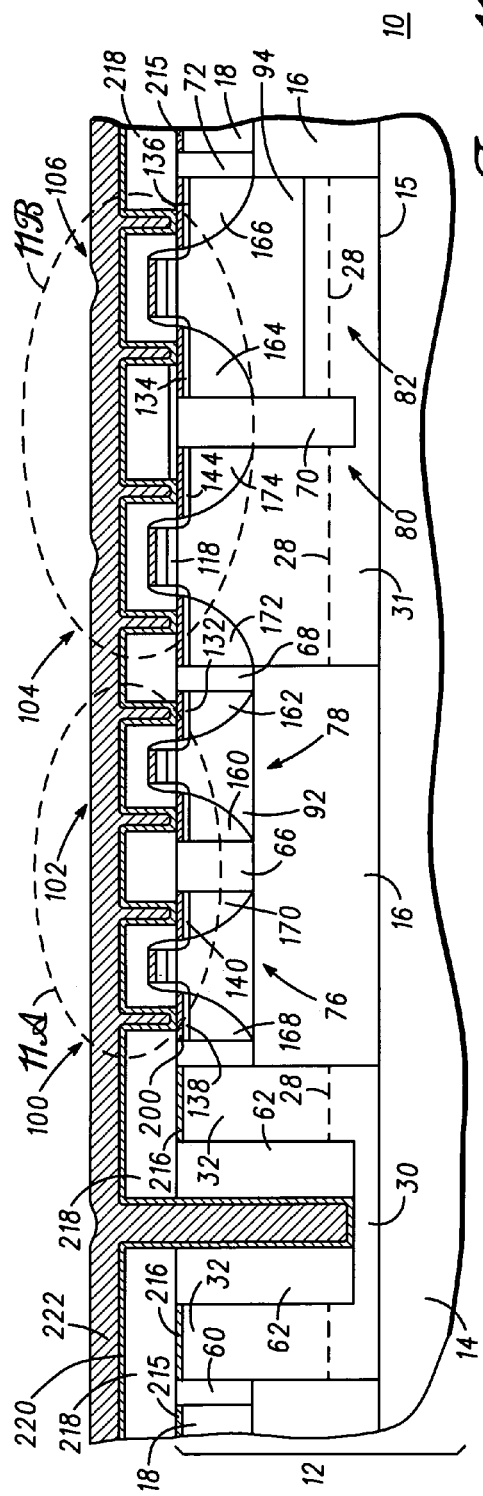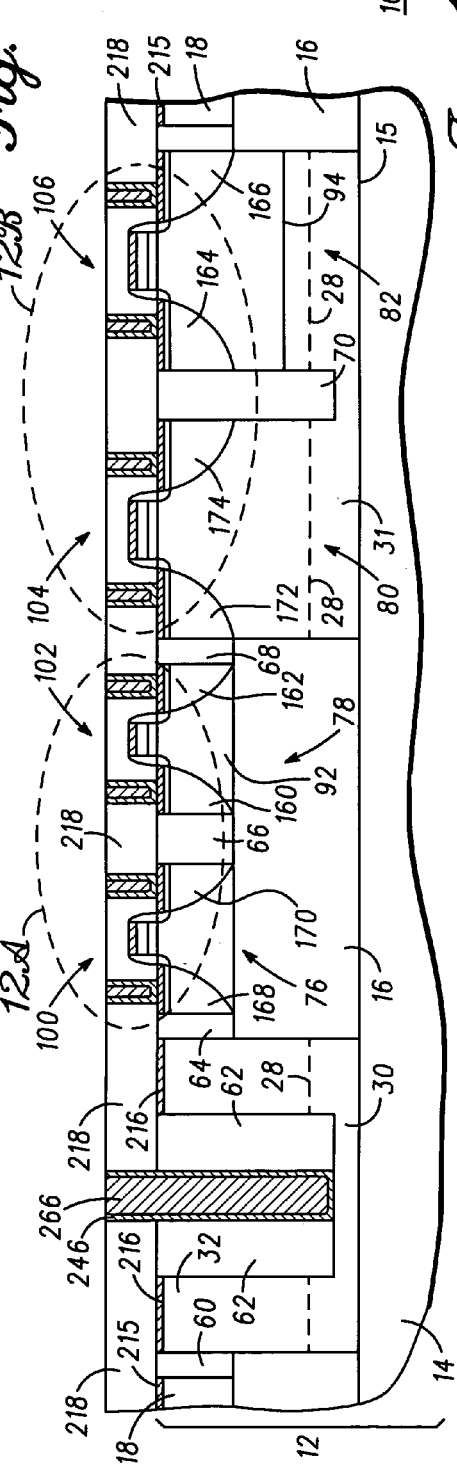

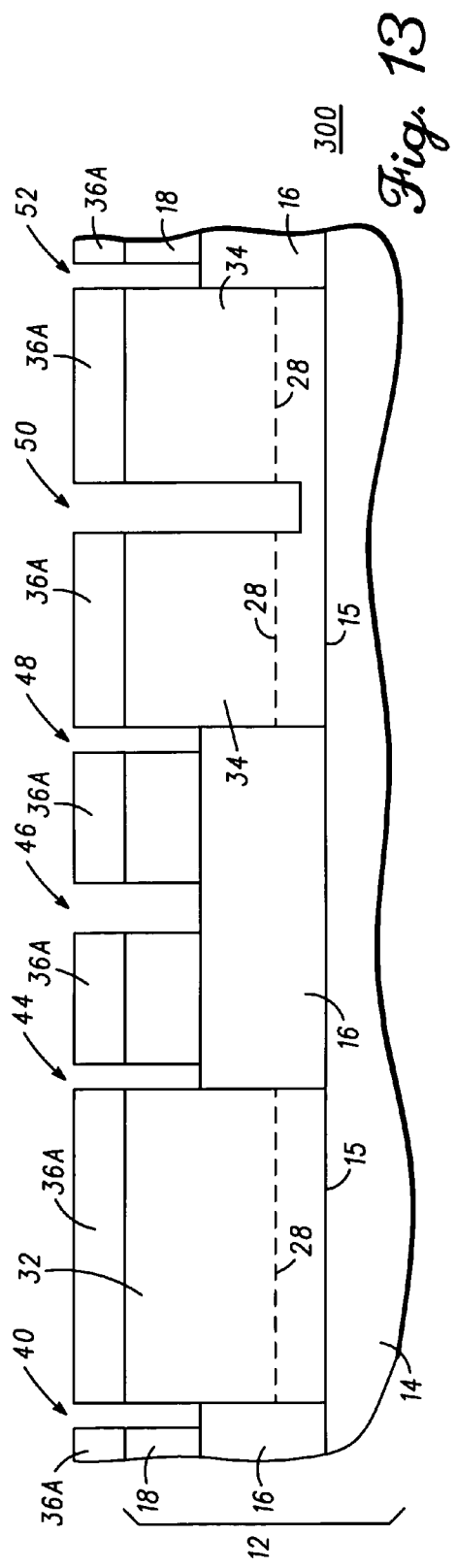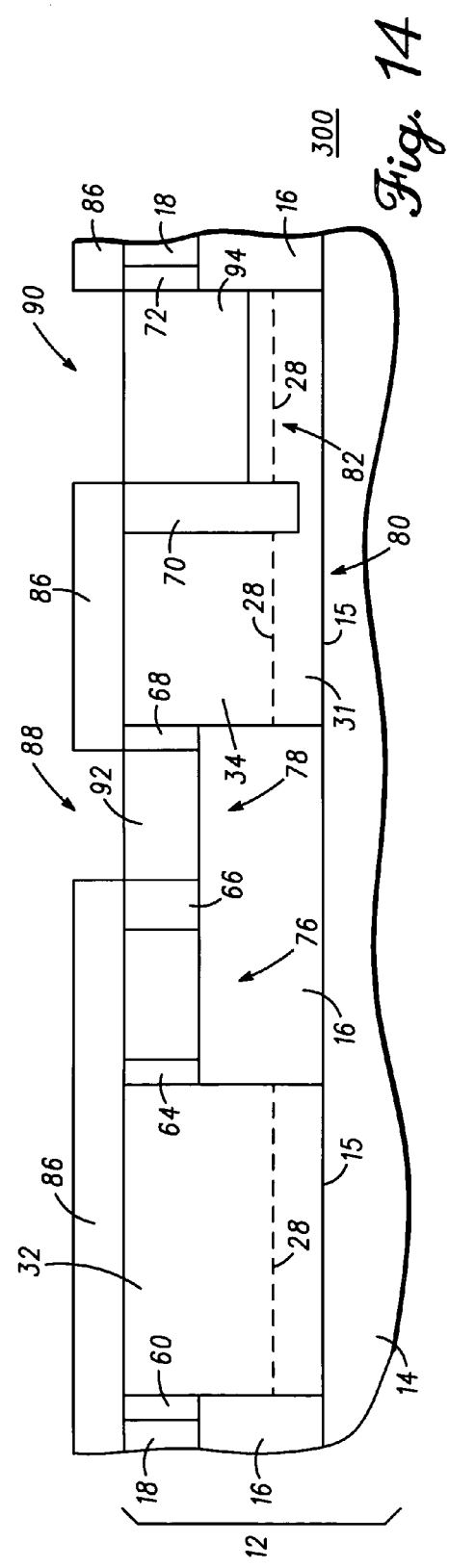

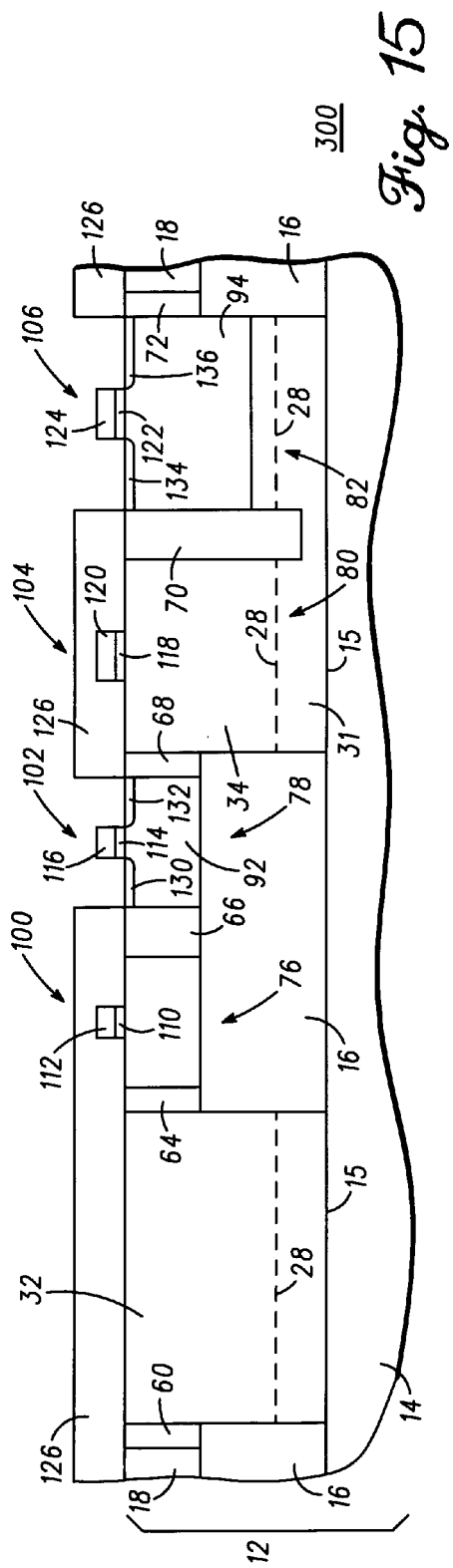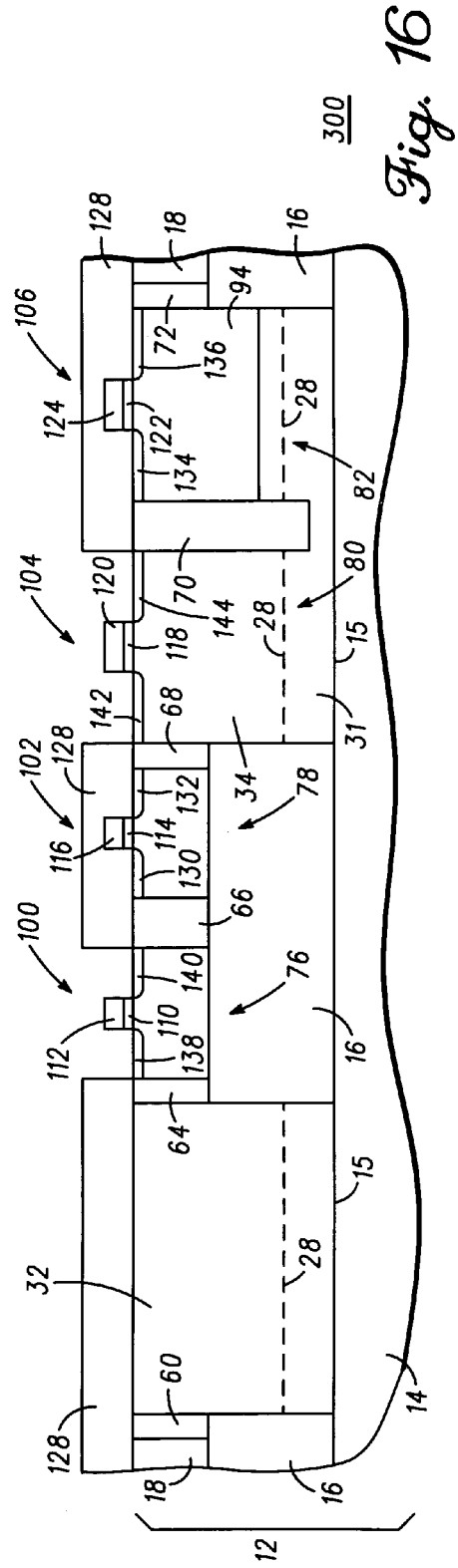

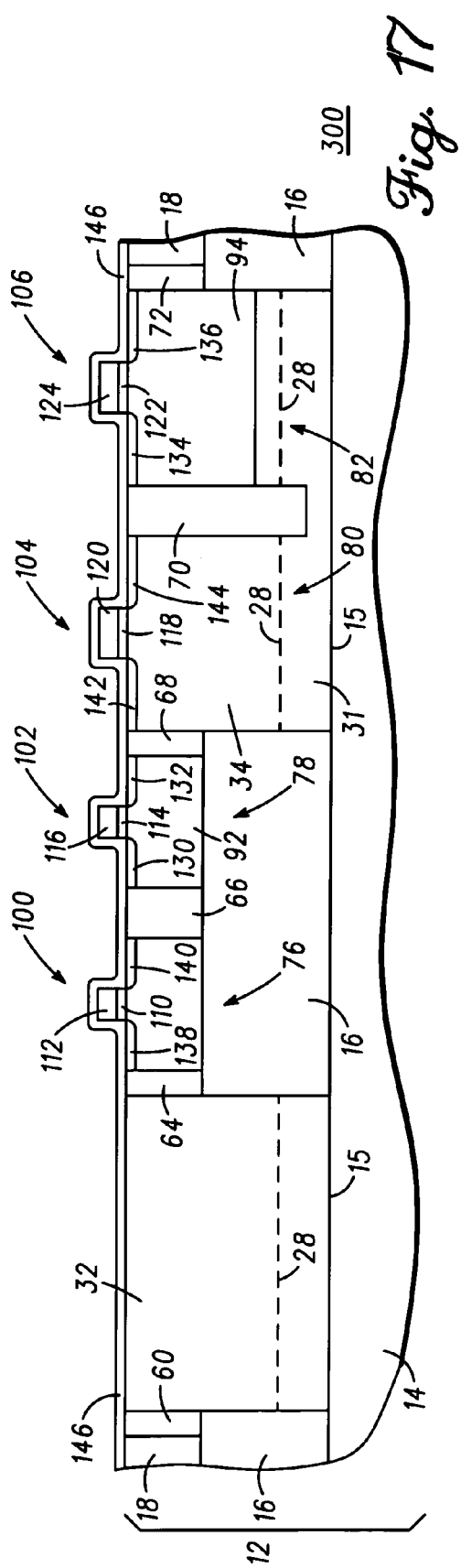
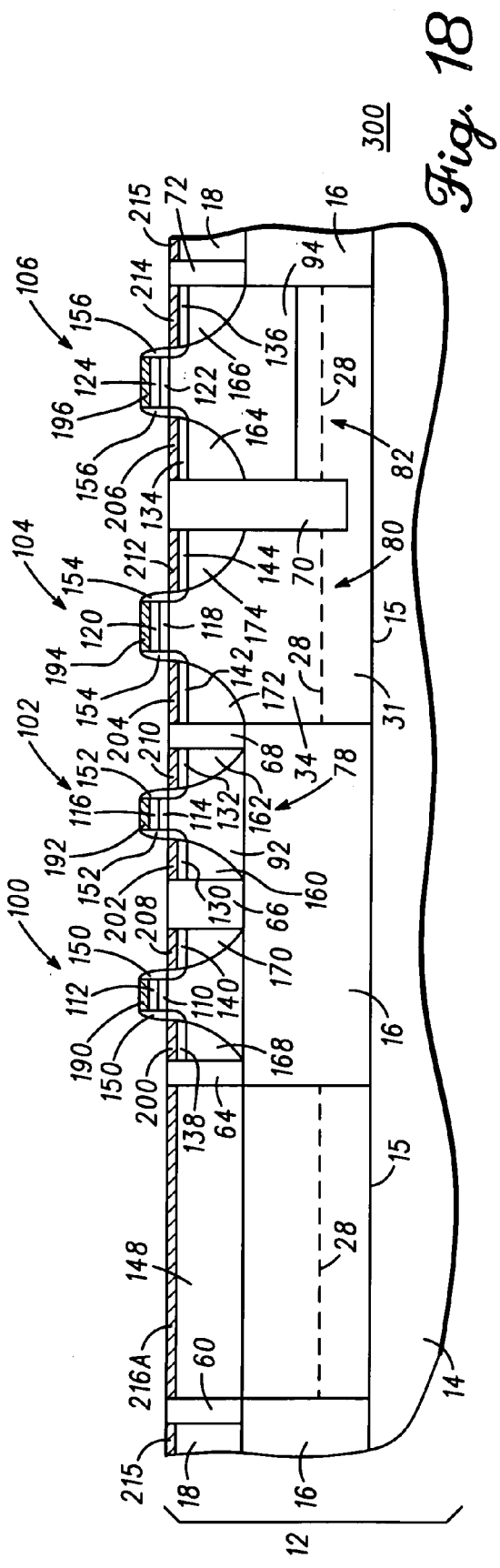

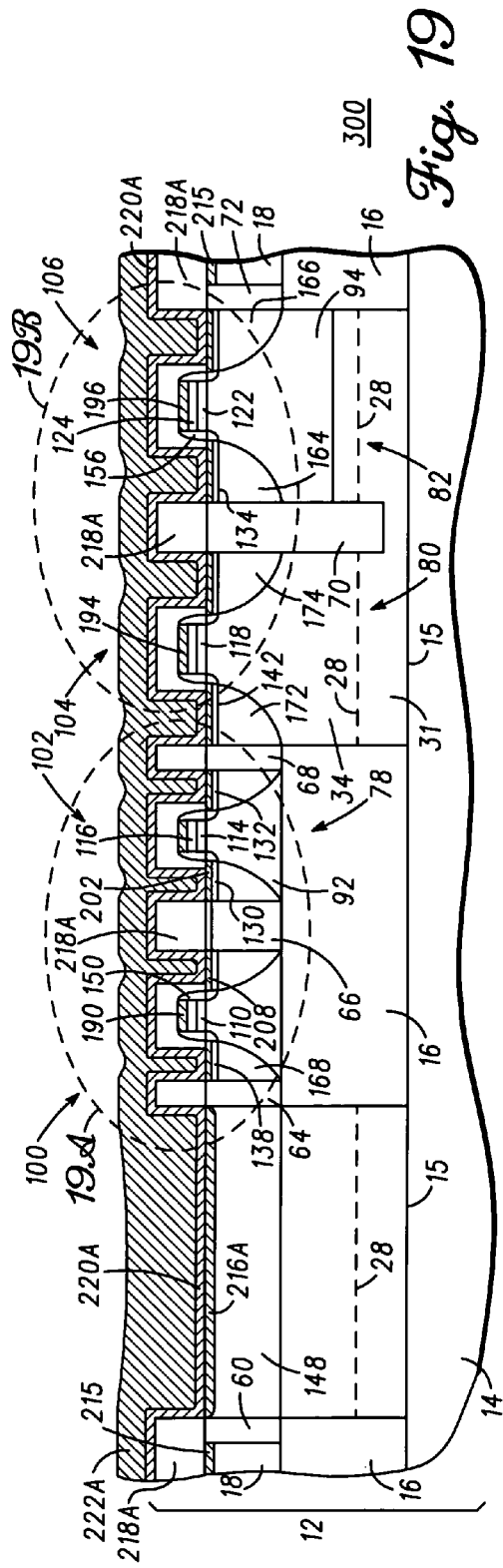
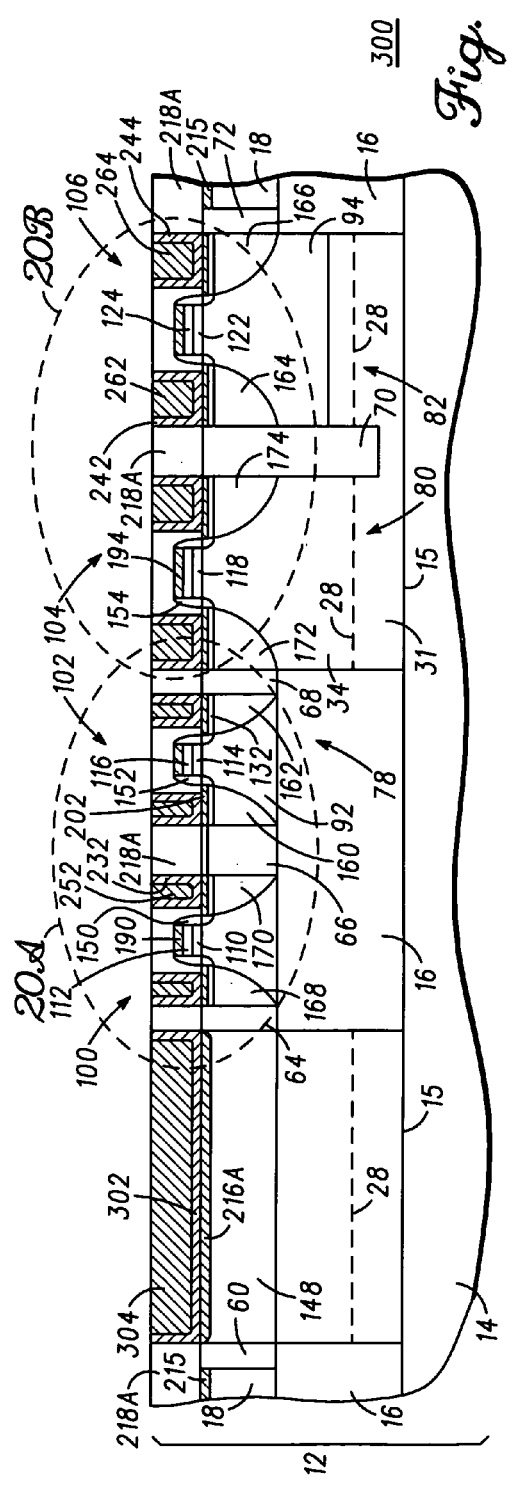

SEMICONDUCTOR COMPONENT AND METHOD OF MANUFACTURE

FIELD OF THE INVENTION

This invention relates, in general, to a semiconductor component and, more particularly, to a Semiconductor-On-Insulator semiconductor component.

BACKGROUND OF THE INVENTION

Semiconductor component manufacturers are constantly striving to improve component performance while lowering their cost of manufacture. One technique for improving performance has been to manufacture semiconductor components using Silicon-On-Insulator (SOI) technology. In this technology, an SOI substrate comprises a dielectric material sandwiched between a relatively thin layer of semiconductor material and a thicker layer of semiconductor material. Semiconductor devices are formed in the thin layer of semiconductor material, whereas the thicker layer of semiconductor material provides support.

Semiconductor devices formed from SOI substrates have lower parasitic capacitances and increased drain currents than similar devices manufactured from bulk silicon substrates. For example, insulated gate field effect transistors or devices manufactured from SOI substrates have a lower source/drain capacitance, which results in faster performance. In addition, oxide isolation is more readily achieved using SOI technology than bulk silicon technology, which shrinks the sizes of the devices and allows for a greater packing density. Other advantages of SOI technology include lower voltage operation, latch-up immunity, and a higher immunity to "soft error" failure.

Although there are many advantages of manufacturing semiconductor devices using SOI technology, there are also several drawbacks. For example, when analog circuits and high performance logic circuits are manufactured using an SOI substrate, the manufacturing processes are typically optimized for the high performance logic circuits, which degrades the performance of the analog circuits. Further, because the dielectric material of an SOI substrate has a low thermal conductivity, heat generated by these types of devices is not readily dissipated away from the devices. Although the heat degrades the performance of both analog and high performance logic circuits, the analog circuits are more sensitive to thermal stresses than the logic circuits.

Accordingly, what is needed is a semiconductor component and a method for manufacturing the semiconductor component using SOI technology that includes both analog and logic circuitry. It would be of further advantage for the method to be time and cost efficient.

SUMMARY OF THE INVENTION

The present invention satisfies the foregoing need by providing an SOI semiconductor component having analog and logic circuitry and methods for manufacturing the SOI semiconductor component. In accordance with one aspect, the present invention includes a method for manufacturing a semiconductor component comprising providing a Semiconductor-on-Insulator (SOI) substrate having a major surface. The SOI substrate has a first layer of semiconductor material, a layer of dielectric material disposed on the first layer of semiconductor material, and a second layer of semiconductor material on the layer of dielectric material. A first active semiconductor device is formed from the first layer of semiconductor material. A second active semiconductor device is formed from the second layer of semiconductor material.

In accordance with another aspect, the present invention includes a method for manufacturing a semiconductor component comprising providing a Semiconductor-on-Insulator (SOI) substrate having a major surface. The SOI substrate comprises a first layer of semiconductor material, a layer of dielectric material disposed on the first layer of semiconductor material, and a second layer of semiconductor material disposed on the layer of dielectric material. First and second trenches are formed in the SOI substrate, wherein the first and second trenches are laterally spaced apart from each other and extend from the major surface into the first layer of semiconductor material. First and second semiconductor materials are formed in the first and second trenches, respectively, such that a portion of the first semiconductor material in the first trench contacts the first layer of semiconductor material and has a first dopant concentration and another portion of the first semiconductor material in the first trench has a second dopant concentration. The portion of the first semiconductor material having the second concentration is disposed on the portion of the first semiconductor material having the first concentration. The a portion of the second semiconductor material formed in the second trench contacts the first layer of semiconductor material and has a first dopant concentration and another portion of the second semiconductor in the second trench has a second dopant concentration. The portion of the second semiconductor material having the second dopant concentration is disposed on the portion of the second semiconductor material having the first concentration. A first semiconductor device is formed from the portion of the first semiconductor material in the first trench. A second semiconductor device is formed from a portion of the second layer of semiconductor material.

In accordance with yet another aspect, the present invention includes a semiconductor component comprising a Semiconductor-on-Insulator (SOI) substrate having a major surface, wherein the SOI substrate has a first layer of semiconductor material, a layer of dielectric material disposed on the first layer of semiconductor material, and a second layer of semiconductor material disposed on the layer of dielectric material. A first epitaxial semiconductor material extends from the first layer of semiconductor material and second epitaxial semiconductor material extends from another portion of the first layer of semiconductor material. The first and second epitaxial semiconductor materials are electrically isolated from each other. A first active semiconductor device is disposed on the first epitaxial semiconductor material. A second active semiconductor device is disposed on the second layer of semiconductor material.

BRIEF DESCRIPTION OF THE DRAWINGS

The present invention will be better understood from a reading of the following detailed description, taken in conjunction with the accompanying drawing figures, in which like reference numbers designate like elements and in which:

FIG. 1 is an enlarged cross-sectional side view of a portion of a partially completed semiconductor component during manufacture in accordance with an embodiment of the present invention;

FIG. 2 is an enlarged cross-sectional side view of the semiconductor component of FIG. 1 further along in processing;

FIG. 3 is an enlarged cross-sectional side view of the semiconductor component of FIG. 2 further along in processing;

FIG. 4 is an enlarged cross-sectional side view of the semiconductor component of FIG. 3 further along in processing;

FIG. 5 is an enlarged cross-sectional side view of the semiconductor component of FIG. 4 further along in processing;

FIG. 6 is an enlarged cross-sectional side view of the semiconductor component of FIG. 5 further along in processing;

FIG. 7 is an enlarged cross-sectional side view of the semiconductor component of FIG. 6 further along in processing;

FIG. 8 is an enlarged cross-sectional side view of the semiconductor component of FIG. 7 further along in processing;

FIG. 9 is an enlarged cross-sectional side view of the semiconductor component of FIG. 8 further along in processing;

FIG. 10 is an enlarged cross-sectional side view of the semiconductor component of FIG. 9 further along in processing;

FIG. 11 is an enlarged cross-sectional side view of the semiconductor component of FIG. 10 further along in processing;

FIG. 12 is an enlarged cross-sectional side view of the semiconductor component of FIG. 11 further along in processing;

FIG. 13 is an enlarged cross-sectional side view of a semiconductor component in accordance with another embodiment of the present invention, wherein the embodiment of FIG. 13 continues from FIG. 3;

FIG. 14 is an enlarged cross-sectional side view of the semiconductor component of FIG. 13 further along in processing;

FIG. 15 is an enlarged cross-sectional side view of the semiconductor component of FIG. 14 further along in processing;

FIG. 16 is an enlarged cross-sectional side view of the semiconductor component of FIG. 15 further along in processing;

FIG. 17 is an enlarged cross-sectional side view of the semiconductor component of FIG. 16 further along in processing;

FIG. 18 is an enlarged cross-sectional side view of the semiconductor component of FIG. 17 further along in processing;

FIG. 19 is an enlarged cross-sectional side view of the semiconductor component of FIG. 18 further along in processing;

FIG. 20 is an enlarged cross-sectional side view of the semiconductor component of FIG. 19 further along in processing.

DETAILED DESCRIPTION

Figure 11A:
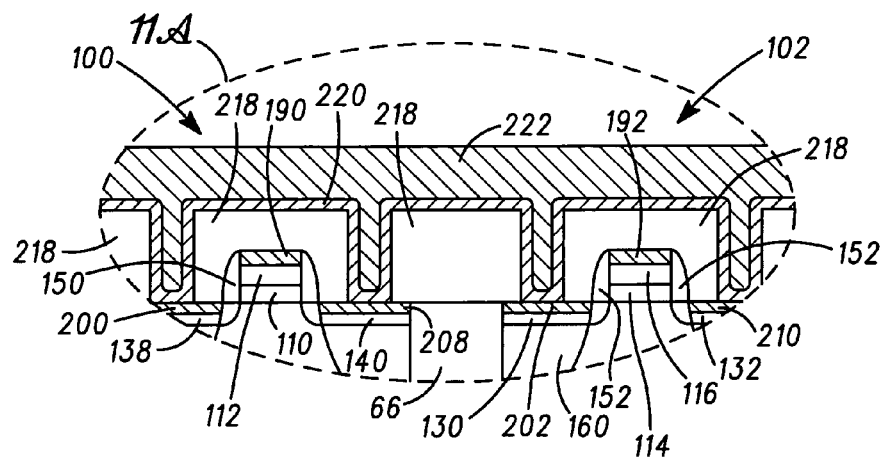
FIGS. 11A and 11B are exploded views of portions of the semiconductor component of FIG. 11.

Generally, the present invention provides a semiconductor component and a method for manufacturing the semiconductor component in which processing steps for the bulk silicon region are decoupled from the high performance logic processing steps that occur in the active wafer of an SOI substrate. In one aspect of the present invention, analog circuitry such as, for example, a phase-locked loop circuit, an input-output circuit, a sense amplifier, an electrostatic discharge protection circuit, a sensor circuit, and the like are manufactured using the support or handle wafer rather than in the active wafer of an SOI substrate. In accordance with one embodiment, epitaxial semiconductor material is grown from the bulk silicon of the support wafer and the analog circuitry is manufactured from this epitaxially grown semiconductor material. Thus, a regionalized bulk silicon area is created in which analog circuitry is fabricated using an SOI process flow. An advantage in manufacturing analog circuitry in the regionalized bulk silicon area is that it dissipates greater amounts of heat than the thin active wafer of an SOI substrate.

In accordance with another aspect, the present invention provides a substrate contact and a method for manufacturing the substrate contact. In accordance with one embodiment, an electrically and thermally conductive material cooperates with highly doped semiconductor material to form the substrate contact. In accordance with another embodiment, the substrate contact comprises highly doped epitaxially grown semiconductor material. The substrate contact provides electrical paths to the handle wafer and increases the amount of heat conducted away from the semiconductor devices.

FIG. 1 is an enlarged cross-sectional side view of a partially completed semiconductor component 10 during processing in accordance with an embodiment of the present invention. What is shown in FIG. 1 is a semiconductor substrate 12 comprising a layer of insulating material 16 sandwiched between two layers of monocrystalline semiconductor material 14 and 18. In accordance with this embodiment, semiconductor material 14 comprises a layer of P-type monocrystalline silicon having a surface 15, a thickness ranging from about 500 micrometers (μm) to about 1,000 μm, and a dopant concentration ranging from about $1 \times 10^{15}$ atoms per cubic centimeter (atoms/cm$^3$) to about $1 \times 10^{16}$ atoms/cm$^3$. Insulating material 16 comprises oxide having a surface 17 and a thickness ranging from about 500 Angstroms (Å) to about 2,000 Å. Silicon layer 18 comprises P-type monocrystalline silicon having a surface 19, a thickness ranging from about 50 Å to about 1,000 Å, and a dopant concentration ranging from about $1 \times 10^{16}$ atoms/cm$^3$ to about $5 \times 10^{17}$ atoms/cm$^3$. Surface 19 serves as a major surface of SOI substrate 12. Techniques for manufacturing SOI substrate 12 are known to those skilled in the art. In an SOI substrate, silicon layer 14 provides structural support for substrate 12. A layer of photoresist is disposed on silicon layer 18. The layer of photoresist is patterned to form an etch mask 20 having openings which expose portions of silicon layer 18.

Referring now to FIG. 2, the portions of silicon layer 18 and dielectric layer 16 unprotected by etch mask 20 are etched using an anisotropic reactive ion etch to form trenches 22 and 24 that expose portions of silicon layer 14. Trench 22 has sidewalls 23 and trench 24 has sidewalls 25. Techniques for patterning a photoresist layer and etching semiconductor material and dielectric material using reactive ion etching are known to those skilled in the art. Etch mask 20 is removed.

A monocrystalline semiconductor material 26 of P-type conductivity and having a surface 27 is epitaxially grown in trenches 22 and 24 and over silicon layer 18. The doping profile of semiconductor material 26 is tailored such that a portion of semiconductor material 26 has a first dopant concentration and a portion of the semiconductor material 26 has a second dopant concentration. In the early stages of epitaxial growth, the dopant concentration ranges from about $1\times10^{18}$ atoms/cm$^3$ to about $1\times10^{19}$ atoms/cm$^3$. After a predetermined amount of silicon is epitaxially grown, the epitaxial reactor is adjusted to change the dopant concentration so that the dopant concentration of the epitaxially grown silicon ranges from about $1\times10^{16}$ atoms/cm$^3$ to about $1\times10^{17}$ atoms/cm$^3$. For example, semiconductor material 26 is grown in an epitaxial reactor in which the first 50 Å to 500 Å of semiconductor material 26 has a dopant concentration ranging from about $1\times10^{18}$ atoms/cm$^3$ to about $1\times10^{19}$ atoms/cm$^3$. Then the epitaxial reactor is adjusted so that the remaining portion of semiconductor layer 26 has a dopant concentration ranging from about $1\times10^{16}$ atoms/cm$^3$ to about $1\times10^{17}$ atoms/cm$^3$. The regions of semiconductor material 26 between surface 15 and broken lines 28 are epitaxially grown silicon having a dopant concentration ranging from about $1\times10^{18}$ atoms/cm$^3$ to about $1\times10^{19}$ atoms/cm$^3$ and the regions of semiconductor material 26 between broken lines 28 and surface 27 are epitaxially grown silicon having a dopant concentration ranging from about $1\times10^{16}$ atoms/cm$^3$ to about $1\times10^{17}$ atoms/cm$^3$. The regions between surface 15 and broken lines 28 are referred to as heavily doped regions 30 and 31. Broken lines 28 are included in FIG. 2 merely to aid in understanding the dopant profile of semiconductor material 26.

Referring now to FIG. 3, semiconductor material 26 is planarized using, for example, a Chemical Mechanical Polishing (CMP) technique. Preferably, the CMP step is a timed etch that removes semiconductor material 26 from silicon layer 18. Thus, the CMP step exposes silicon layer 18. After planarization, portion 32 of semiconductor material 26 remains in opening 22 and portion 34 of semiconductor material 26 remains in opening 24. Portion 32 is referred to as a contact portion and portion 34 is referred to as a bulk portion. As those skilled in the art are aware, Chemical Mechanical Polishing is also referred to as Chemical Mechanical Planarization. Other suitable planarization techniques include electropolishing, electrochemical polishing, chemical polishing, and chemically enhanced planarization.

Referring now to FIG. 4, a layer of photoresist is disposed on silicon layer 18, contact portion 32, and bulk portion 34 of semiconductor material 26. The layer of photoresist is patterned to form an etch mask 36 having openings that expose portions of silicon layer 18, contact portion 32, and bulk portion 34.

Referring now to FIG. 5, the portions of silicon layer 18, contact portion 32, and bulk portion 34 unprotected by etch mask 36 are etched using a timed anisotropic reactive ion etch that preferentially etches semiconductor material versus dielectric material. The reactive ion etch forms shallow trenches 40, 42, 44, 46, 48, 50, and 52. Because the reactive ion etch preferentially etches semiconductor material, the etch forming trenches 40, 44, 46, 48, and 52 stops on oxide layer 16. The etch that forms trenches 42 and 50 continues etching contact portion 32 and bulk portion 34, respectively, until a desired amount of time has elapsed. In other words, the anisotropic etch is a timed etch. Preferably, trenches 42 and 50 extend into the heavily doped regions 30 and 31, respectively.

Referring now to FIG. 6, trenches 40, 42, 44, 46, 48, 50, and 52 are filled with a dielectric material that extends over silicon layer 18, contact portion 32, and bulk portion 34 of semiconductor material 26. Preferably, the dielectric material filling trenches 40-52 is silicon dioxide. The dielectric material is planarized using a CMP technique that is selective to semiconductor material. Thus, the planarization stops or endpoints on silicon layer 18, contact portion 32, and bulk portion 34, thereby forming planarized oxide filled trench structures 60, 62, 64, 66, 68, 70, and 72. Oxide filled trench structures 60, 64, 66, 68, 70, and 72 serve as Shallow Trench Isolation (STI) structures. STI structure 70 divides bulk portion 34 into two sub-portions comprising active regions 80 and 82. STI structures 68 and 70 cooperate to electrically isolate active region 80 from active regions 78 and 82. STI structures 70 and 72 cooperate to electrically isolate active region 82 from active region 80 and silicon layer 18. STI structures 64 and 66 electrically isolate active region 76 from contact portion 32 and active region 78. STI structures 66 and 68 electrically isolate active region 78 from active regions 76 and 80. STI structure 60 electrically isolates contact portion 32 from silicon layer 18. Trench isolation structure 62 is formed within contact portion 32 and undergoes further processing as described with reference to FIGS. 7-12, 11A-B, and 12A-B to form a contact structure.

Although not shown, it should be understood that the dielectric material of trench isolation structure 62 may extend over contact portion 32 and merge with or overlap STI structures 60 and 64. Thus, isolation structure 62 and STI structures 60 and 64 form a unitary structure.

Still referring to FIG. 6, a layer of photoresist is disposed on silicon layer 18, active regions 76, 78, 80, and 82, contact portion 32 of semiconductor material 26, STI structures 60, 64, 66, 68, 70, and 72, and trench isolation structure 62. The layer of photoresist is patterned to form a masking structure 86. Masking structure 86 has openings 88 and 90 that expose active regions 78 and 82, respectively. A dopant or impurity material is implanted through openings 88 and 90 and into active regions 78 and 82 to form wells 92 and 94, respectively. Preferably the dopant is an impurity material of N-type conductivity having a dopant concentration ranging from about $1\times10^{16}$ atoms/cm$^3$ to about $1\times10^{17}$ atoms/cm$^3$. Thus, wells 92 and 94 are preferably N-wells. However, it should be understood that the conductivity type of the wells is not a limitation of the present invention and that one or both wells can be P-type conductivity.

Referring now to FIG. 7, gate structures 100, 102, 104, and 106 are formed on active regions 76 and 80 and N-wells 92 and 94, respectively. More particularly, gate structure 100 is formed on active region 76, gate structure 102 is formed on N-well 92, gate structure 104 is formed on active region 80, and gate structure 106 is formed on N-well 94. Gate structure 100 comprises a gate oxide 110 disposed on active region 76 and a gate conductor 112 disposed on gate oxide 110. Gate structure 102 comprises a gate oxide 114 disposed on N-well 92 and a gate conductor 116 disposed on gate oxide 114. Gate structure 104 comprises a gate oxide 118 disposed on active region 80 and a gate conductor 120 disposed on gate oxide 118. Gate structure 106 comprises a gate oxide 122 disposed on N-well 94 and a gate conductor 124 disposed on gate oxide 122.

Still referring to FIG. 7, a layer of photoresist is disposed on silicon layer 18, active regions 76 and 80, N-wells 92 and 94, contact portion 32 of semiconductor material 26, STI structures 60, 64, 66, 68, 70, and 72, trench isolation structure 62, and gate structures 100-106. The layer of photoresist is patterned to form an implant screen mask 126 having openings that expose N-wells 92 and 94. A dopant or impurity material of P-type conductivity is implanted through the openings to form source and drain extension regions 130 and 132, respectively, in N-well 92 and source and drain extension regions 134 and 136, respectively, in N-well 94. By way of example, source extension regions 130 and 134 and drain extension regions 132 and 136 have a dopant concentration ranging from about $1\times10^{18}$ atoms/cm$^3$ to about $5\times10^{18}$ atoms/cm$^3$.

Referring now to FIG. 8, implant screen mask 126 is removed and a layer of photoresist is disposed on silicon layer 18, active regions 76 and 80, N-wells 92 and 94, contact portion 32 of semiconductor material 26, STI structures 60, 64, 66, 68, 70, and 72, trench isolation structure 62, and gate structures 100-106. The layer of photoresist is patterned to form an implant screen mask 128 having openings that expose active regions 76 and 80. A dopant or impurity material of N-type conductivity is implanted through the openings to form source and drain extension regions 138 and 140, respectively, in active region 76 and source and drain extension regions 142 and 144, respectively, in active region 80. By way of example, source extension regions 138 and 142 and drain extension regions 140 and 144 have a dopant concentration ranging from about $1\times10^{18}$ atoms/cm$^3$ to about $5\times10^{18}$ atoms/cm$^3$.

Referring now to FIG. 9, implant screen mask 128 is removed and a layer of dielectric material 146 is formed on silicon layer 18, active regions 76 and 80, N-wells 92 and 94, contact portion 32 of semiconductor material 26, STI structures 60, 64, 66, 68, 70, and 72, trench isolation structure 62, and gate structures 100-106. By way of example, dielectric layer 146 is oxide having a thickness ranging from about 500 Å to about 1,500 Å.

Referring now to FIG. 10, dielectric layer 146 is anisotropically etched to form spacers along gate structures 100-106. More particularly, spacers 150 are formed along the sidewalls of gate structure 100, spacers 152 are formed along the sidewalls of gate structure 102, spacers 154 are formed along the sidewalls of gate structure 104, and spacers 156 are formed along the sidewalls of gate structure 106.

Still referring to FIG. 10, a layer of photoresist is disposed on silicon layer 18, active regions 76 and 80, N-wells 92 and 94, contact portion 32 of semiconductor material 26, STI structures 60, 64, 66, 68, 70, and 72, trench isolation structure 62, gate structures 100-106, and spacers 150-156. The layer of photoresist is patterned to form a masking structure (not shown) similar to implant screen mask 126, i.e., the masking structure exposes N-wells 92 and 94. A dopant or impurity material of P-type conductivity is implanted through the openings to form source and drain regions 160 and 162, respectively, in N-well 92 and source and drain regions 164 and 166, respectively, in N-well 94. By way of example, source regions 160 and 164 and drain regions 162 and 166 have a dopant concentration ranging from about $5\times10^{18}$ atoms/cm$^3$ to about $1\times10^{19}$ atoms/cm$^3$.

The masking structure is removed and another layer of photoresist is disposed on silicon layer 18, active regions 76 and 80, N-wells 92 and 94, contact portion 32 of semiconductor material 26, STI structures 60, 64, 66, 68, 70, and 72, trench isolation structure 62, gate structures 100-106, and spacers 150-156. The layer of photoresist is patterned to form an implant screen mask (not shown) similar to implant screen mask 128, i.e. the masking structure has openings that expose active regions 76 and 80. A dopant or impurity material of N-type conductivity is implanted through the openings to form source and drain regions 168 and 170, respectively, in active region 76 and source and drain regions 172 and 174, respectively, in active region 80. By way of example, source regions 168 and 172 and drain regions 170 and 174 have a dopant concentration ranging from about $5\times10^{18}$ atoms/cm$^3$ to about $1\times10^{19}$ atoms/cm$^3$. The implant screen mask is removed.

A layer of refractory metal (not shown) such as, for example, cobalt, is conformally deposited on the exposed portions of silicon layer 18, active regions 76 and 80, N-wells 92 and 94, contact portion 32 of semiconductor material 26, STI structures 60, 64, 66, 68, 70, and 72, trench isolation structure 62, gate structures 100-106, and spacers 150-156. The refractory metal is heated to a temperature ranging between about 400° C. and about 700° C. The heat treatment causes the cobalt to react with the silicon to form cobalt silicide (CoSi$_2$) in all regions in which the cobalt is in contact with silicon, i.e., cobalt silicide 190, 192, 194, and 196 is formed from gates 112, 116, 120, and 124, respectively, cobalt silicide 200, 202, 204, and 206 is formed from source regions 168, 160, 172, and 164, respectively, cobalt silicide 208, 210, 212, and 214 is formed from drain regions 170, 162, 174, and 166, respectively, cobalt silicide 215 is formed from silicon layer 18, and cobalt silicide 216 is formed from contact portion 32. By way of example, the thickness of the cobalt silicide ranges from about 100 Å to about 300 Å. For the sake of clarity, the reference numbers for the cobalt silicide formed from gates 112, 116, 120, and 124, source regions 168, 160, 172, and 164, and drain regions 170, 162, 174, and 166 are excluded from FIG. 10, but are shown in FIGS. 11A, 11B, 12A, and 12B. The portions of the cobalt on non-silicon regions remains unreacted. The unreacted cobalt is then removed using processes known to those skilled in the art. It should be understood that the type of silicide is not a limitation of the present invention. For example, other suitable silicides include titanium silicide, nickel silicide, platinum silicide, or the like. The silicide forms a portion of the active region of the semiconductor component.

Still referring to FIG. 10, a layer of dielectric material 218 is disposed on cobalt silicide layers 190, 192, 194, 196, 200, 202, 204, 206, 208, 210, 212, 214, 215, and 216, STI structures 60, 64, 66, 68, 70, and 72, trench isolation structure 62, and spacers 150-156. By way of example, dielectric material 218 is oxide having a thickness ranging from about 500 Å to about 2,000 Å. A layer of photoresist is patterned to form an etch mask 177 having openings that expose portions of dielectric layer 218 over source regions 160, 164, 168, and 172, drain regions 162, 166, 170, and 174, and a portion of filled trench structure 62. The exposed portions of dielectric layer 218 are anisotropically etched to expose portions of source regions 160, 164, 168, and 172, drain regions 162, 166, 170, and 174, and filled trench structure 62. The etch preferentially etches dielectric material versus silicon. Thus, the etch stops on source regions 160, 164, 168, and 172, drain regions 162, 166, 170, and 174, and continues into the dielectric material of filled trench structure 62. The etch forms a trench 178 that extends to the heavily doped region of contact portion 32.

Figure 11B:
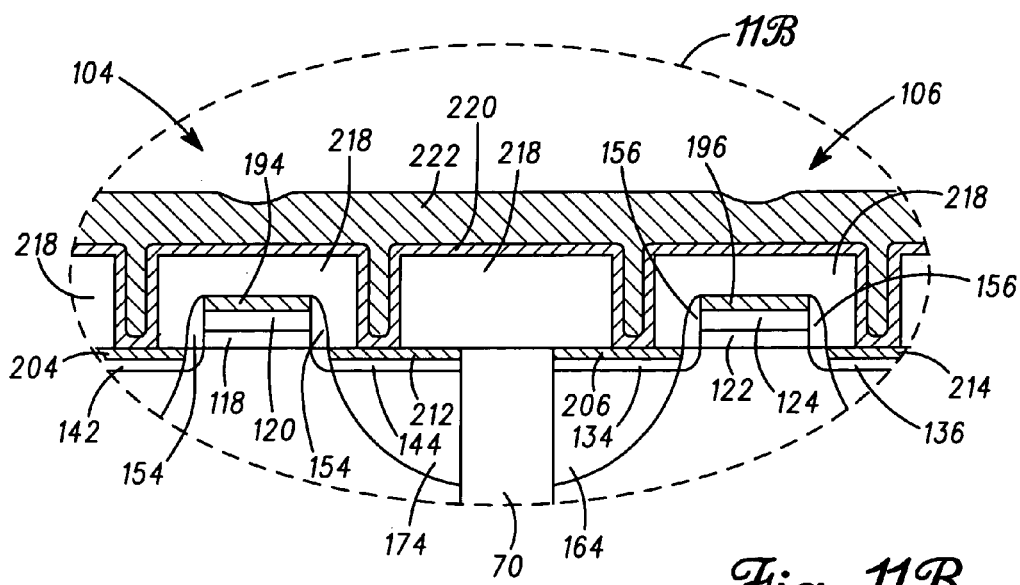

Referring now to FIGS. 11, 11A, and 11B, etch mask 177 is removed and a liner 220 having a thickness ranging from about 50 Å to about 350 Å is formed on dielectric layer 218 and the exposed portions of silicided layers or regions 200-216. By way of example, liner 220 is a bilayer structure comprising a titanium contact layer having a titanium nitride layer formed thereon. Suitable techniques for forming liner 220 include Chemical Vapor Deposition (CVD), Plasma Enhanced Chemical Vapor Deposition (PECVD), Atomic Layer Deposition (ALD), or the like. Other suitable materials for liner 220 include tantalum (Ta), titanium nitride (TiN), tantalum nitride (TaN), a tantalum (Ta) and tantalum nitride (TaN) combination, tungsten (W), tungsten nitride (WN), titanium silicon nitride (TiSiN), and refractory metal compounds such as refractory metal nitrides, refractory metal carbides, and refractory metal borides. Although liner 220 is shown as being a conformal layer, it should be understood that this is not a limitation of the present invention. In addition, the number of layers for liner 220 is not a limitation of the present invention.

An electrically conductive material 222 having a thickness ranging from about 4,000 Å to about 8,000 Å is formed on liner 220. By way of example, the electrically conductive material is tungsten. Alternatively, layer 222 may be copper or silver. Although not shown, it should be understood that contacts are also formed to the silicide formed from the gate structures.

Figure 12A:
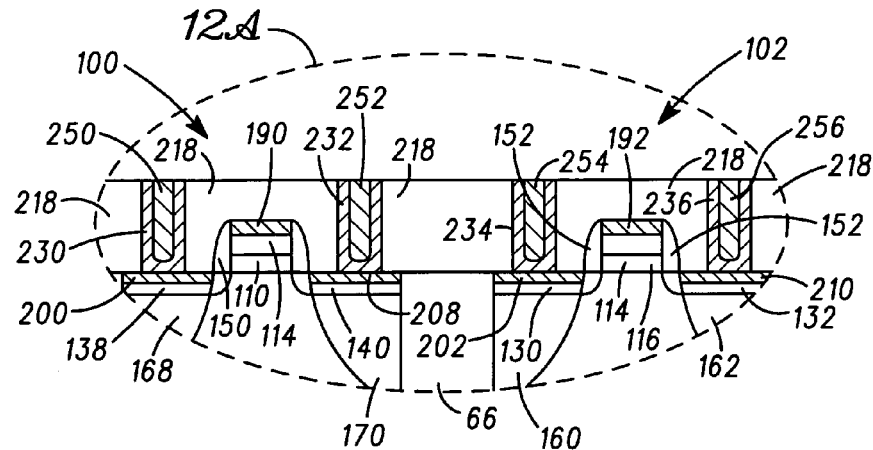
FIGS. 12A and 12B are exploded views of portions of the semiconductor component of FIG. 12.
Figure 12B:
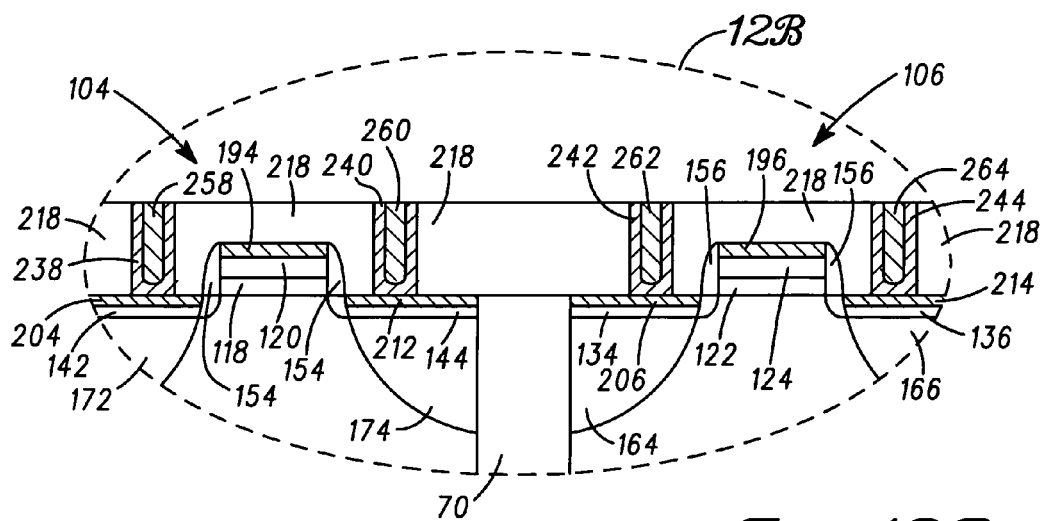

Referring now to FIGS. 12, 12A, and 12B electrically conductive material 222 is planarized using, for example, a CMP technique having a high selectivity to dielectric layer 218. Thus, the planarization stops on dielectric layer 218. For the sake of clarity, exploded views of portions of FIG. 12 have been shown as FIGS. 12A and 12B. More particularly, the portion of FIG. 12 within the dashed circle identified by reference character 12A is shown in FIG. 12A and the portion of FIG. 12 within the dashed circle identified by reference character 12B is shown in FIG. 12B. FIGS. 12, 12A, and 12B are described together.

After planarization, portion 230 of liner 220 and portion 250 of electrically conductive material 222 remain and form a source contact to source silicide 200 and portion 232 of liner 220 and portion 252 of electrically conductive material 222 remain and form a drain contact to drain silicide 208. The source and drain contacts cooperate with gate structure 100 to form a semiconductor device. Similarly, portion 234 of liner 220 and portion 254 of electrically conductive material 222 remain and form a source contact to source silicide 202 and portion 236 of liner 220 and portion 256 of electrically conductive material 222 remain and form a drain contact to drain silicide 210, where the source and drain contacts cooperate with gate structure 102 to form a semiconductor device. Portion 238 of liner 220 and portion 258 of electrically conductive material 222 remain and form a source contact to source silicide 204 and portion 240 of liner 220 and portion 260 of electrically conductive material 222 remain and form a drain contact to drain silicide 212, where the source and drain contacts cooperate with gate structure 104 to form a semiconductor device. Portion 242 of liner 220 and portion 262 of electrically conductive material 222 remain and form a source contact to source silicide 206 and portion 244 of liner 220 and portion 264 of electrically conductive material 222 remain and form a drain contact to drain silicide 214, where the source and drain contacts cooperate with gate structure 106 to form a semiconductor device. Portion 246 of liner 220 and portion 266 of electrically conductive material 222 remain and form a substrate contact. It should be understood that if the contact resistance between portion 246 and heavily doped region 30 is too high, silicide can be formed from heavily doped region 30 by adding another masking step to form trench 178 prior to silicide formation. The planarization technique is not a limitation of the present invention. For example, other planarization techniques include electropolishing, electrochemical polishing, chemical polishing, and chemically enhanced planarization.

FIG. 13 is a cross-sectional side view of a semiconductor component 300 during manufacture in accordance with another embodiment of the present invention. Semiconductor component 300 is similar to semiconductor component 10, except that the configuration of the substrate contact is different. The manufacturing steps for semiconductor component 300 are similar to those for semiconductor component 10 except that instead of forming a trench isolation structure like structure 62 in contact portion 32, contact portion 32 is heavily doped. Preferably, contact portion 32 is heavily doped using the same implant that is used for forming the source and drain regions 164 and 166, respectively, described with reference to FIG. 10. For the sake of simplicity, like reference numbers used for the description of semiconductor component 10 (shown in FIGS. 1-12, 11A-B, and 12A-B) have also been used in the description of semiconductor component 300 shown in FIG. 13. However reference number 300 has been used for identifying the semiconductor component of FIGS. 13-20, 19A-B, and 20A-B to distinguish it from semiconductor component 10 shown in FIGS. 1-12, 11A-B, and 12A-B. Because the difference between semiconductor component 10 and semiconductor component 300 is the configuration of the contact structure, the description of the formation of semiconductor component 10 in FIGS. 1-3 applies to that of semiconductor component 300. Thus, the description of semiconductor component 300 continues from FIG. 3.

Still referring to FIG. 13, a layer of photoresist is disposed on silicon layer 18, contact portion 32, and bulk portion 34 of semiconductor material 26. The layer of photoresist is patterned to form an etch mask 36A. It should be noted that the difference between etch mask 36A and masking structure 36 is that etch mask 36A does not include an opening to expose a portion of contact portion 32. The portions of silicon layer 18 and bulk portion 34 unprotected by etch mask 36A are etched using a timed anisotropic reactive ion etch that preferentially etches semiconductor material versus dielectric material. The reactive ion etch forms shallow trenches 40, 44, 46, 48, 50, and 52. Because the reactive ion etch preferentially etches semiconductor material, the etch forming trenches 40, 44, 46, 48, and 52 stops on oxide layer 16. The etch that forms trench 50 continues etching bulk portion 34 until the desired time has elapsed. Preferably, trench 50 extends into the heavily doped region 31. Etch mask 36A is removed.

Referring now to FIG. 14, trenches 40, 44, 46, 48, 50, and 52 are filled with a dielectric material. Preferably, the dielectric material filling trenches 40-52 is silicon dioxide. The dielectric material extends over silicon layer 18, contact portion 32, and bulk portion 34 of semiconductor material 26. The dielectric material is planarized using a CMP technique that is selective to semiconductor material. Thus, the planarization stops or endpoints on silicon layer 18, contact portion 32, and bulk portion 34, thereby forming planarized oxide filled trench structures 60, 64, 66, 68, 70, and 72. Oxide filled trench structures 60, 64, 66, 68, 70, and 72 serve as Shallow Trench Isolation (STI) structures. STI structure 70 divides bulk portion 34 into two sub-portions comprising active regions 80 and 82. STI structures 68 and 70 cooperate to electrically isolate active region 80 from active regions 78 and 82. STI structures 70 and 72 cooperate to electrically isolate active region 82 from active region 80 and silicon layer 18. STI structures 64 and 66 electrically isolate active region 76 from contact portion 32 and active region 78. STI structures 66 and 68 electrically isolate active region 78 from active regions 76 and 80.

Still referring to FIG. 14, a layer of photoresist is disposed on silicon layer 18, active regions 76 and 80, N-wells 92 and 94, contact portion 32 of semiconductor material 26, and STI structures 60, 64, 66, 68, 70, and 72. The layer of photoresist is patterned to form an implant screen mask 86 having openings 88 and 90 that expose active regions 78 and 82, respectively. A dopant or impurity material is implanted through openings 88 and 90 and into active regions 78 and 82 to form wells 92 and 94, respectively. Preferably the dopant is an impurity material of N-type conductivity having a dopant concentration ranging from about $1 \times 10^{16}$ atoms/cm$^3$ to about $1 \times 10^{17}$ atoms/cm$^3$. Thus, wells 92 and 94 are preferably N-wells. However, it should be understood that the conductivity type of the wells is not a limitation of the present invention and that one or both wells can be P-type conductivity.

Referring now to FIG. 15, gate structures 100, 102, 104, and 106 are formed on active regions 76 and 80, N-wells 92 and 94, respectively. More particularly, gate structure 100 is formed on active region 76, gate structure 102 is formed on N-well 92, gate structure 104 is formed on active region 80, and gate structure 106 is formed on N-well 94. Gate structure 100 comprises a gate oxide 110 disposed on active region 76 and a gate conductor 112 disposed on gate oxide 110. Gate structure 102 comprises a gate oxide 114 disposed on N-well 92 and a gate conductor 116 disposed on gate oxide 114. Gate structure 104 comprises a gate oxide 118 disposed on active region 80 and a gate conductor 120 disposed on gate oxide 118. Gate structure 106 comprises a gate oxide 122 disposed on N-well 94 and a gate conductor 124 disposed on gate oxide 122.

Still referring to FIG. 15, a layer of photoresist is disposed on silicon layer 18, active regions 76 and 80, N-wells 92 and 94, contact portion 32, STI structures 60, 64, 66, 68, 70, and 72, and gate structures 100-106. The layer of photoresist is patterned to form an etch mask 126 having openings that expose N-wells 92 and 94. A dopant or impurity material of P-type conductivity is implanted through the openings to form source and drain extension regions 130 and 132, respectively, in N-well 92 and source and drain extension regions 134 and 136, respectively, in N-well 94. By way of example, source extension regions 130 and 134 and drain extension regions 132 and 136 have a dopant concentration ranging from about $1 \times 10^{18}$ atoms/cm$^3$ to about $5 \times 10^{18}$ atoms/cm$^3$.

Referring now to FIG. 16, implant screen mask 126 is removed and a layer of photoresist is disposed on silicon layer 18, active regions 76 and 80, N-wells 92 and 94, contact portion 32, STI structures 60, 64, 66, 68, 70, and 72, and gate structures 100-106. The layer of photoresist is patterned to form an implant screen mask 128 having openings that expose active regions 76 and 80. A dopant or impurity material of N-type conductivity is implanted through the openings to form source and drain extension regions 138 and 140, respectively, in active region 76 and source and drain extension regions 142 and 144, respectively, in active region 80. By way of example, source extension regions 138 and 142 and drain extension regions 140 and 144 have a dopant concentration ranging from about $1 \times 10^{18}$ atoms/cm$^3$ to about $5 \times 10^{18}$ atoms/cm$^3$.

Referring now to FIG. 17, implant screen mask 128 is removed and a layer of dielectric material 146 is formed on silicon layer 18, active regions 76 and 80, N-wells 92 and 94, contact portion 32 of semiconductor material 26, STI structures 60, 64, 66, 68, 70, and 72, and gate structures 100-106. By way of example, dielectric layer 146 is oxide having a thickness ranging from about 500 Å to about 1,500 Å.

Referring now to FIG. 18, dielectric layer 146 is anisotropically etched to form spacers along gate structures 100-106. The anisotropic etch forms spacers 150 along the sidewalls of gate structure 100, spacers 152 along the sidewalls of gate structure 102, spacers 154 along the sidewalls of gate structures 104, and spacers 156 along the sidewalls of gate structure 106. A layer of photoresist is disposed on silicon layer 18, active regions 76 and 80, N-wells 92 and 94, contact portion 32 of semiconductor material 26, STI structures 60, 64, 66, 68, 70, and 72, gate structures 100-106, and spacers 150-156. The layer of photoresist is patterned to form an implant screen mask (not shown) that exposes contact region 32 and N-wells 92 and 94. A dopant or impurity material of P-type conductivity is implanted through the openings to form a doped region 148 in portion 32, source and drain regions 160 and 162, respectively, in N-well 92 and source and drain regions 164 and 166, respectively, in N-well 94. By way of example, doped region 148, source regions 160 and 164, and drain regions 162 and 166 have a dopant concentration ranging from about $5 \times 10^{18}$ atoms/cm$^3$ to about $1 \times 10^{19}$ atoms/cm$^3$.

The implant screen mask is removed and another layer of photoresist is disposed on silicon layer 18, active regions 76 and 80, N-wells 92 and 94, contact portion 32 of semiconductor material 26, STI structures 60, 64, 66, 68, 70, and 72, gate structures 100-106, and spacers 150-156. The layer of photoresist is patterned to form an implant screen mask (not shown) similar to implant screen mask 128, i.e. the implant screen mask also has openings that expose active regions 76 and 80. A dopant or impurity material of N-type conductivity is implanted through the openings to form source and drain regions 168 and 170, respectively, in active region 76 and source and drain regions 172 and 174, respectively, in active region 80. By way of example, source regions 166 and 170 and drain regions 168 and 174 have a dopant concentration ranging from about $5 \times 10^{18}$ atoms/cm$^3$ to about $1 \times 10^{19}$ atoms/cm$^3$. The implant screen mask is removed.

A layer of refractory metal (not shown) such as, for example, cobalt, is conformally deposited on the exposed portions of silicon layer 18, active regions 76 and 80, N-wells 92 and 94, doped region 148 of contact portion 32, STI structures 60, 64, 66, 68, 70, and 72, gate structures 100-106, and spacers 150-156. The refractory metal is heated to a temperature ranging between about 400° C. and about 700° C. The heat treatment causes the cobalt to react with the silicon to form cobalt silicide (CoSi$_2$) in all regions in which the cobalt is in contact with silicon, i.e., cobalt silicide 190, 192, 194, and 196 is formed from gates 112, 116, 120, and 124, respectively, cobalt silicide 200, 202, 204, and 206 is formed from source regions 168, 160, 172, and 164, respectively, cobalt silicide 208, 210, 212, and 214 is formed from drain regions 170, 162, 174, and 166, respectively, cobalt silicide 215 is formed from silicon layer 18, and cobalt silicide 216A is formed from doped region 148. By way of example, the thickness of the cobalt silicide ranges from about 100 Å to about 300 Å. The portions of the cobalt on non-silicon regions remains unreacted. The unreacted cobalt is then removed using processes known to those skilled in the art. It should be understood that the type of silicide is not a limitation of the present invention. For example, other suitable silicides include titanium silicide, nickel silicide, platinum silicide, or the like. The silicide forms a portion of the active region of the semiconductor component.

Figure 19A:
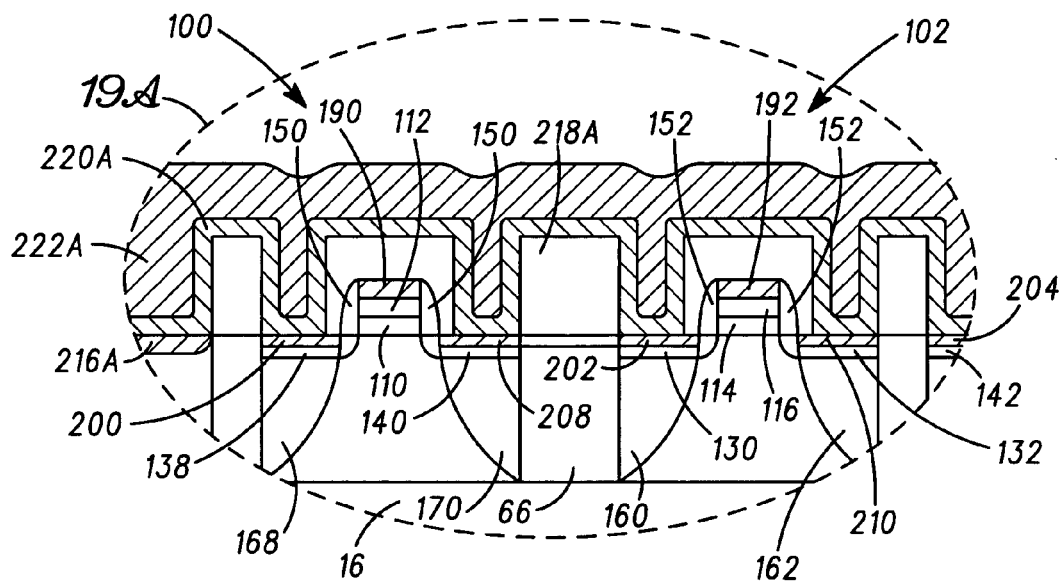
FIGS. 19A and 19B are exploded views of portions of the semiconductor component of FIG. 19.
Figure 19B:
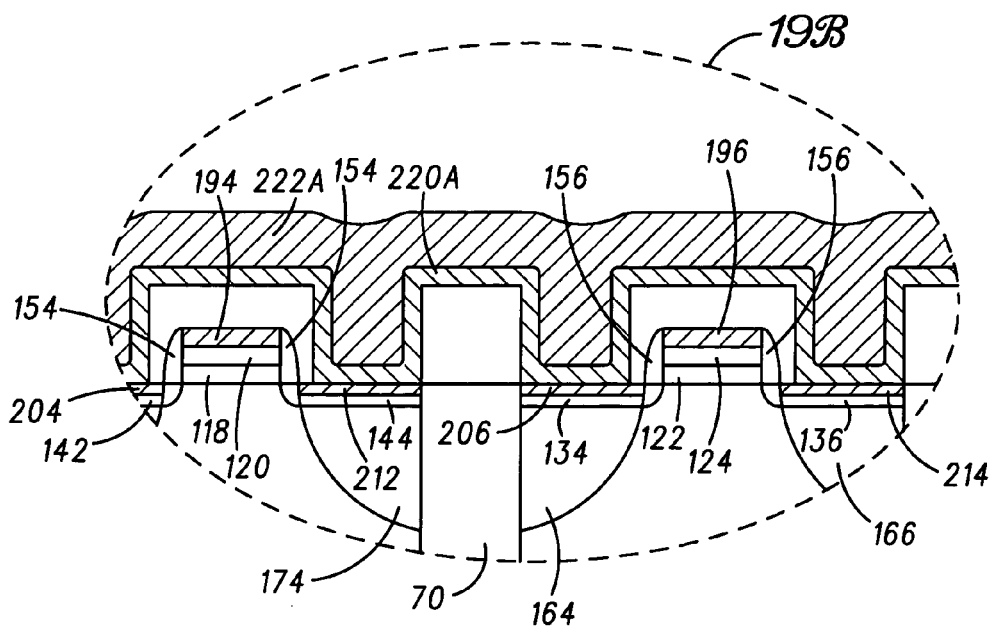

Referring now to FIGS. 19, 19A, and 19B, a layer of dielectric material 218A is formed on the silicided regions 190, 192, 194, 196, 200, 202, 204, 206, 208, 210, 212, 214, and 216A, STI structures 60, 64, 66, 68, 70, and 72, gate structures 100-106, and spacers 150-156. For the sake of clarity, exploded views of portions of FIG. 19 have been shown as FIGS. 19A and 19B. More particularly, the portion of FIG. 19 within the dashed circle identified by reference character 19A is shown in FIG. 19A and the portion of FIG. 19 within the dashed circle identified by reference character 19B is shown in FIG. 19B. FIGS. 19, 19A, and 19B are described together. By way of example, dielectric material 218A is oxide having a thickness ranging from about 500 Å to about 2,000 Å. Openings are formed in oxide layer 218A to expose portions of silicide layers 200-214 and 216A. A liner 220A having a thickness ranging from about 50 Å to about 350 Å is formed on dielectric layer 218A, spacers 150-156, and the exposed portions of silicided layers or regions 200-214 and 216A. By way of example, liner 220A is a bilayer structure comprising a titanium contact layer having a titanium nitride layer formed thereon. Suitable techniques for forming liner 220A are similar to those described with reference to liner 220 shown in FIG. 11.

Still referring to FIGS. 19, 19A, and 19B, an electrically conductive material 222A having a thickness ranging between approximately 4,000 Å and approximately 8,000 Å is formed on liner 220A. By way of example, the electrically conductive material is tungsten. Alternatively, layer 222A may be copper or silver. Although not shown, it should be understood that contacts are also formed to the silicide formed from the gate structures.

Figure 20A:
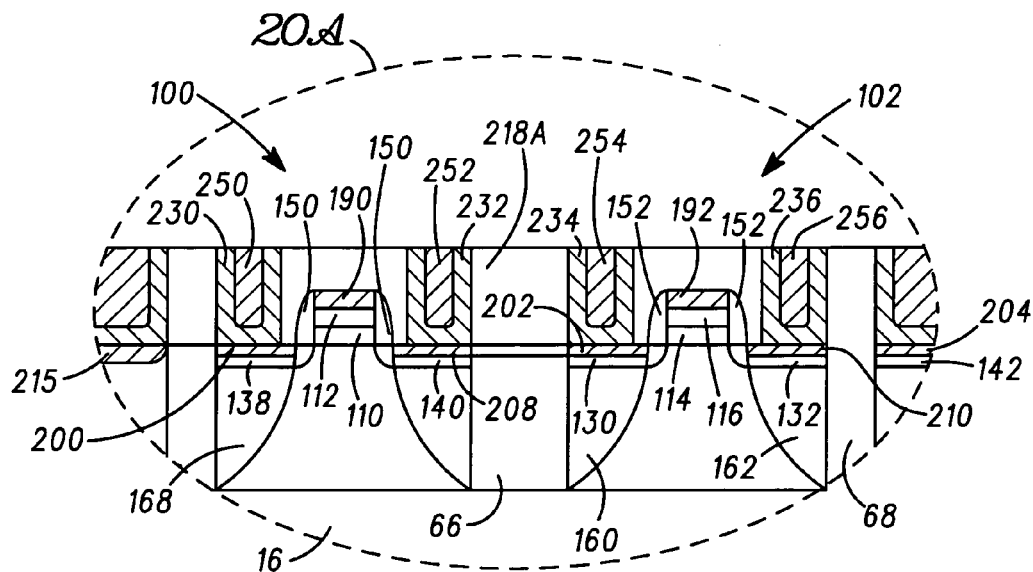
FIGS. 20A and 20B are exploded views of portions of the semiconductor component of FIG. 20.
Figure 20B:
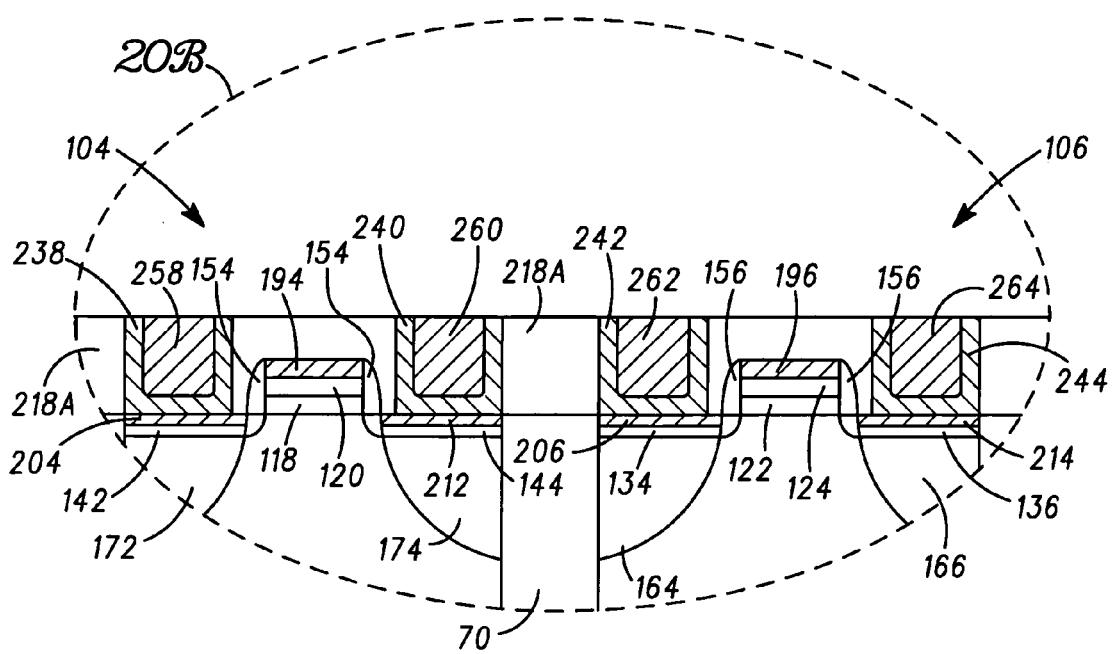

Referring now to FIGS. 20, 20A, and 20B, electrically conductive material 222A is planarized using, for example, a CMP technique having a high selectivity to dielectric layer 218A. The planarization stops on dielectric layer 218A. For the sake of clarity, exploded views of portions of FIG. 20 have been shown as FIGS. 20A and 20B. More particularly, the portion of FIG. 20 within the dashed circle identified by reference character 20A is shown in FIG. 20A and the portion of FIG. 20 within the dashed circle identified by reference character 20B is shown in FIG. 20B. FIGS. 20, 20A, and 20B are described together.

After planarization, portion 230 of liner 220A and portion 250 of electrically conductive material 222A remain and form a source contact to source silicide 200 and portion 232 of liner 220A and portion 252 of electrically conductive material 222A remain and form a drain contact to drain silicide 208. The source and drain contacts cooperate with gate structure 100 to form a semiconductor device. Similarly, portion 234 of liner 220A and portion 254 of electrically conductive material 222A remain and form a source contact to source silicide 202 and portion 236 of liner 220A and portion 256 of electrically conductive material 222A remain and form a drain contact to drain silicide 210, wherein the source and drain contacts cooperate with gate structure 102 to form a semiconductor device. Portion 238 of liner 220A and portion 258 of electrically conductive material 222A remain and form a source contact to source silicide 204 and portion 240 of liner 220A and portion 260 of electrically conductive material 222A remain and form a drain contact to drain silicide 212, wherein the source and drain contacts cooperate with gate structure 104 to form a semiconductor device. Portion 242 of liner 220A and portion 262 of electrically conductive material 222A remain and form a source contact to source silicide 206 and portions 244 of liner 220A and 264 of electrically conductive material 222A remain and form a drain contact to drain silicide 214, wherein the source and drain contacts cooperate with gate structure 106 to form a semiconductor device. Portion 302 of liner 220A and portion 304 of electrically conductive material 222A remain and form a substrate contact. It should be understood that the planarization technique is not a limitation of the present invention. For example, other planarization techniques include electropolishing, electrochemical polishing, chemical polishing, and chemically enhanced planarization.

Although certain preferred embodiments and methods have been disclosed herein, it will be apparent from the foregoing disclosure to those skilled in the art that variations and modifications of such embodiments and methods may be made without departing from the spirit and scope of the invention. For example, the dielectric material through which the contact openings are manufactured may be either low dielectric constant or high dielectric constant dielectric material. It is intended that the invention shall be limited only to the extent required by the appended claims and the rules and principles of applicable law.

What is claimed is:

1. A method for manufacturing a semiconductor component, comprising:
   providing a Semiconductor-on-Insulator (SOI) substrate having a major surface, the SOI substrate comprising a first layer of semiconductor material, a layer of dielectric material disposed on the first layer of semiconductor material, and a second layer of semiconductor material disposed on the layer of dielectric material;
   forming first and second trenches in the SOI substrate, the first and second trenches laterally spaced apart horn each other and extending from the major surface into the first layer of semiconductor material;
   forming first and second epitaxial semiconductor materials in the first and second trenches, respectively, wherein a portion of the first epitaxial semiconductor material in the first trench contacts the first layer of semiconductor material and has a first dopant concentration and a portion of the first epitaxial semiconductor material in the first trench that is spaced apart from the first layer of semiconductor material has a second dopant concentration and wherein a portion of the second epitaxial semiconductor material in the second trench contacts the first layer of semiconductor material and has a first dopant concentration and a portion of the second epitaxial semiconductor material that is spaced apart from the first layer of semiconductor material has a second dopant concentration;
   forming a first semiconductor device from the portion of the first epitaxial semiconductor material in the first trench; and
   forming a second semiconductor device from a portion of the second layer of semiconductor material.

2. The method of claim 1, further including forming a substrate contact from the second epitaxial semiconductor material in the second trench.

3. The method of claim 2, wherein forming the substrate contact includes:
   forming a trench in the second epitaxial semiconductor material in the second trench;
   forming a dielectric material in the trench in the second epitaxial semiconductor material;
   forming an opening in the dielectric material in the trench in the second epitaxial semiconductor material; and
   forming an electrically conductive material in the opening.

4. The method of claim 3, wherein the electrically conductive material is selected from the group of electrically conductive materials consisting of titanium, tungsten, copper, aluminum, and doped semiconductor material.

5. The method of claim 1, wherein forming the first semiconductor device includes doping a portion of the second epitaxial semiconductor material in the second trench with an impurity material of the first conductivity type;
   forming a first trench in the second layer of semiconductor material and the layer of dielectric material, wherein the trench exposes a portion of the first layer of semiconductor material;
   forming the first epitaxial semiconductor material in the first trench;
   forming a gate structure on the first epitaxial semiconductor material, the gate structure having first and second sides; and
   forming a source region in the first epitaxial semiconductor material adjacent the first side of the gate structure and a drain region in the first epitaxial semiconductor material adjacent the second side of the gate structure.

6. A method for manufacturing a semiconductor component, comprising:
   providing a Semiconductor-on-Insulator (SOI) substrate having a major surface, the SOI substrate comprising a first layer of semiconductor material, a layer of dielectric material disposed on the first layer of semiconductor material, and a second layer of semiconductor material on the layer of dielectric material;
   forming a first active semiconductor device from the first layer of semiconductor material; and
   forming a second active semiconductor device from the second layer of semiconductor material;
   forming an electrical contact to the first layer of semiconductor material, wherein forming the electrical contact includes forming a first shallow trench that extends through the second layer of semiconductor material and the layer of dielectric material;
   forming a second shallow trench that extends through the second layer of semiconductor material, and the layer of dielectric material, the second shallow trench laterally spaced apart from the first shallow trench, wherein forming the second shallow trench includes extending the second shallow trench into the first layer of semiconductor material;
   forming semiconductor material of a first conductivity type in the first and second shallow trenches, wherein forming the semiconductor material in the first and second shallow trenches includes epitaxially growing the semiconductor material in the first and second shallow trenches.

7. The method of claim 6, wherein forming the semiconductor material in the first and second shallow trenches includes forming a first portion of the semiconductor material in the first shallow trench to have a first dopant concentration and a second portion of the semiconductor material in the first shallow trench to have a second dopant concentration.

8. The method of claim 7, wherein the first dopant concentration is greater than the second dopant concentration, and wherein the first portion of the semiconductor material contacts the second layer of semiconductor material.

9. The method of claim 7, further including forming a first portion of the semiconductor material in the second shallow trench to have a third dopant concentration and a second portion of the semiconductor material in the second shallow trench to have a fourth dopant concentration.

10. The method of claim 9, wherein the first and third dopant concentrations are substantially the same and the second and fourth dopant concentrations are substantially the same.

11. The method of claim 9, further including forming first and second shallow trench isolation structures in the second layer of semiconductor material, wherein the first shallow trench isolation structure extends from the major surface to the first layer of dielectric material and the second shallow trench isolation structure extends from the major surface through the first semiconductor material in the first shallow trench to the portion of the first semiconductor material having the first dopant concentration.

12. The method of claim 11, wherein forming the electrical contact comprises:
   forming a trench in the semiconductor material filling the second shallow trench, the trench extending from the first major surface to the portion of the first semiconductor material having the first dopant concentration;
   forming a dielectric material in the trench;
   forming an opening in the dielectric material, the opening extending to the portion of the first semiconductor material having the first dopant concentration; and
   forming an electrically conductive material in the opening.

13. The method of claim 12, wherein forming the electrically conductive material in the opening includes selecting the electrically conductive material from the group of electrically conductive materials consisting of tungsten, an alloy of tungsten, titanium, an alloy of titanium, tantalum, an alloy of tantalum, copper, an alloy of copper, aluminum, and an alloy of aluminum.

* * * * *